(12) United States Patent
Fujiwara et al.

(10) Patent No.: US 7,914,972 B2
(45) Date of Patent: Mar. 29, 2011

(54) EXPOSURE METHOD AND DEVICE MANUFACTURING METHOD

(75) Inventors: Tomoharu Fujiwara, Ageo (JP); Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 664 days.

(21) Appl. No.: 11/632,855

(22) PCT Filed: Jul. 20, 2005

(86) PCT No.: PCT/JP2005/013311
§ 371 (c)(1),
(2), (4) Date: Apr. 5, 2007

(87) PCT Pub. No.: WO2006/009169
PCT Pub. Date: Jan. 26, 2006

(65) Prior Publication Data
US 2007/0196774 A1    Aug. 23, 2007

(30) Foreign Application Priority Data

Jul. 21, 2004 (JP) .............................. 2004-212756
Jun. 29, 2005 (JP) .............................. 2005-190728

(51) Int. Cl.
*G03F 7/20* (2006.01)
(52) U.S. Cl. .................. 430/311; 430/327; 430/961
(58) Field of Classification Search .................. 430/311, 430/327, 961
See application file for complete search history.

(56) References Cited

U.S. PATENT DOCUMENTS

| | | | |
|---|---|---|---|
| 5,194,893 A | 3/1993 | Nishi | |
| 5,528,118 A | 6/1996 | Lee | |
| 5,623,853 A | 4/1997 | Novak et al. | |
| 5,815,246 A | 9/1998 | Sperling et al. | |
| 5,825,043 A | 10/1998 | Suwa | |
| 5,874,820 A | 2/1999 | Lee | |
| 6,195,154 B1 | 2/2001 | Imai | |
| 6,400,441 B1 | 6/2002 | Nishi et al. | |
| 6,778,257 B2 | 8/2004 | Bleeker et al. | |
| 6,897,963 B1 | 5/2005 | Taniguchi et al. | |
| 2002/0054231 A1 | 5/2002 | Masuyuki | |
| 2004/0169834 A1 | 9/2004 | Richter et al. | |
| 2005/0069819 A1 | 3/2005 | Shiobara | |

(Continued)

FOREIGN PATENT DOCUMENTS

DE    102 53 679 A1    6/2004

(Continued)

OTHER PUBLICATIONS

Jun. 19, 2009 Search Report for European Patent Application No. 05766260.03.

(Continued)

*Primary Examiner* — Kathleen Duda
(74) *Attorney, Agent, or Firm* — Oliff & Berridge, PLC

(57) ABSTRACT

An exposure method is provided in which a substrate is favorably exposed in a state with a liquid being retained in a desired condition. An upper surface (1A) of a base material (1) that is used as the substrate (P) to be exposed via the liquid has an effective region (4) coated with a photosensitive material (2), and at least part of the surface of the base material (1) is coated with a first material (3) such that the surface of the base material (1) does not come into contact with the liquid on an outside of the effective region (4).

22 Claims, 14 Drawing Sheets

U.S. PATENT DOCUMENTS

| | | | |
|---|---|---|---|
| 2005/0237504 A1 | 10/2005 | Nagasaka et al. | |
| 2006/0098178 A1 | 5/2006 | Nagasaka et al. | |
| 2006/0162858 A1* | 7/2006 | Akimoto et al. | 156/272.8 |
| 2007/0242242 A1 | 10/2007 | Nagasaka et al. | |
| 2009/0002655 A1 | 1/2009 | Nagasaka et al. | |
| 2009/0079950 A1 | 3/2009 | Nagasaka et al. | |

FOREIGN PATENT DOCUMENTS

| | | |
|---|---|---|
| EP | 1 118 390 A2 | 7/2001 |
| EP | 1 396 760 A2 | 3/2004 |
| EP | 1 429 188 A2 | 6/2004 |
| EP | 1 571 698 A1 | 9/2005 |
| EP | 1571698 * | 9/2005 |
| EP | 1 596 251 A1 | 11/2005 |
| EP | 1 641 028 A1 | 3/2006 |
| EP | 1 699 072 A1 | 9/2006 |
| JP | A 6-53120 | 2/1994 |
| JP | A 6-124873 | 5/1994 |
| JP | A 6-188169 | 7/1994 |
| JP | A-08-037149 | 2/1996 |
| JP | A-08-166475 | 6/1996 |
| JP | A-08-330224 | 12/1996 |
| JP | A-10-163099 | 6/1998 |
| JP | A-10-214783 | 8/1998 |
| JP | A 10-303114 | 11/1998 |
| JP | A 11-135400 | 5/1999 |
| JP | A-11-260686 | 9/1999 |
| JP | A 11-260686 | 9/1999 |
| JP | AT-2000-505958 | 5/2000 |
| JP | A-2000-164504 | 6/2000 |
| JP | A-2000-331913 | 11/2000 |
| JP | A-2001-345245 | 12/2001 |
| JP | A-2003-207804 | 7/2003 |
| JP | A 2004-289118 | 10/2004 |
| JP | A-2005-109146 | 4/2005 |
| JP | A-2005-183709 | 7/2005 |
| JP | A 2005-209706 | 8/2005 |
| JP | A-2005-209706 | 8/2005 |
| JP | A 2005-286286 | 10/2005 |
| WO | WO 99/49504 | 9/1999 |
| WO | WO 01/35168 A1 | 5/2001 |
| WO | WO 2004/019128 A2 | 3/2004 |
| WO | 2004/053956 * | 6/2004 |
| WO | WO 2004/053956 A1 | 6/2004 |
| WO | WO 2004/074937 | 9/2004 |
| WO | WO 2004-112108 A1 | 12/2004 |
| WO | WO 2005/055296 A1 | 6/2005 |
| WO | WO 2005/078525 A2 | 8/2005 |

OTHER PUBLICATIONS

Sep. 30, 2009 Office Action for European Patent Application No. 05766260.03.

Notice of Allowance issued in Singapore Application No. 200700492-2; mailed Mar. 16, 2009.

International Search Report issued in PCT Patent Application No. PCT/JP2005/013311; mailed Oct. 25, 2005; with translation.

Written Opinion issued in PCT Patent Application No. PCT/JP2005/013311; mailed Oct. 25, 2005; with translation.

Office Action issued in Japanese Patent Application No. 2006-529242; mailed Aug. 3, 2010; with translation.

Office Action issued in Israeli Application No. 180840; mailed Aug. 31, 2010; with translation.

Office Action issued in Singapore Application No. 200700492-2; mailed Jun. 30, 2008.

Office Action issued in European Application No. 05766260.3 on Dec. 16, 2010.

* cited by examiner

EXPOSURE METHOD AND DEVICE MANUFACTURING METHOD

TECHNICAL FIELD

The present invention relates to an exposure method that exposes a substrate via a liquid and to a device manufacturing method.

Priority is claimed on Japanese Patent Application No. 2004-212756, filed on Jul. 21, 2004 and Japanese Patent Application No. 2005-190728, filed on Jun. 29, 2005, the contents of which are incorporated herein by reference.

BACKGROUND ART

Semiconductor devices and liquid crystal display devices are manufactured through a technique known as photolithography technique, by which a pattern formed on a mask is transferred onto a photosensitive substrate. The exposure apparatus used in the photolithography process has a mask stage that supports a mask and a substrate stage that supports a substrate, and while successively moving the mask stage and the substrate stage, transfers the mask pattern via a projection optical system onto the substrate. In recent years, there has been demand for higher resolution projection optical systems in order to handle the much higher levels of integration of device patterns. As the exposure wavelength to be used is shorter, the resolution of the projection optical system becomes higher. As the numerical aperture of the projection optical system is larger, the resolution of the projection optical system becomes higher. Consequently, the exposure wavelength used in exposure apparatuses has shortened year by year, and the numerical aperture of projection optical systems has also increased. Furthermore, the current mainstream exposure wavelength is 248 nm (KrF excimer laser), but an even shorter wavelength of 193 nm (ArF excimer laser) is now gradually being put to practical use. In addition, as well as resolution, the depth of focus (DOF) is also important when performing an exposure. The resolution R and the depth of focus δ are respectively expressed by the following formulas:

$$R = k_1 \cdot \lambda / NA, \quad (1)$$

$$\delta = \pm k_2 \cdot \lambda / NA^2, \quad (2)$$

where λ is the exposure wavelength, NA is the numerical aperture of the projection optical system, and $k_1$ and $k_2$ are process coefficients. It can be seen from formulas (1) and (2) that if, to enhance the resolution R, the wavelength λ is shortened and the numerical aperture NA is increased, then the depth of focus δ becomes narrower.

When the depth of focus δ becomes too narrow, it becomes difficult to make the substrate surface coincide with the image plane of the projection optical system, and thus there is the possibility that the focus margin during the exposure operation will be insufficient. To address this problem, the liquid immersion method, which is disclosed in, e.g., Patent Document 1 below, has been proposed as a method to make the exposure wavelength substantially shorter and to make the depth of focus substantially broader. This liquid immersion method is designed to fill the space between the under surface of the projection optical system and the substrate surface with a liquid, e.g., water or organic solvent, to form a liquid immersion region and thus by taking advantage of the fact that the wavelength of the exposure light in the liquid becomes 1/n times (n is the refractive index of the liquid and is generally approximately 1.2 to 1.6) of that in the air, improve the resolution and, at the same time, enlarge the depth of focus by approximately n times.

Patent Document 1: PCT International Publication No. WO 99/49504 pamphlet

DISCLOSURE OF INVENTION

Problems to be Solved by the Invention

The above-mentioned photosensitive substrate is a base material, such as a semiconductor wafer, that is coated with a photosensitive material. In the liquid immersion method, the liquid that forms the liquid immersion region comes into contact with the substrate. However, there are cases in which the peripheral region of the substrate is not coated with the photosensitive material. When this region uncoated with the photosensitive material comes into contact with the liquid, a substance that constitutes the surface (foundation) of the base material may be eluted into the liquid. The substance eluted into the liquid acts as an impurity. Therefore, there is the possibility that the liquid containing the impurity contaminates various devices and members that constitute the substrate or the exposure apparatus, thus influencing performance of the devices formed or exposure accuracy of the exposure apparatus.

Furthermore, in an exposure apparatus that uses the liquid immersion method, there is the possibility that when the liquid immersion region is formed so as to spread across an edge of the substrate, the liquid penetrates through a gap formed around the substrate, thus contaminating the backside of the substrate or the member that holds the substrate.

The present invention has been achieved in view of such circumstances, and has an object to provide an exposure method that can favorably expose a substrate with a liquid being retained in a desired condition and provide, by use of the exposure method, a device manufacturing method that can manufacture a device with the capability of exhibiting a desired performance. Furthermore, the present invention has an object to provide an exposure method that can suppress penetration of a liquid through a gap formed in at least a part of a periphery of the substrate and provide, by use of the exposure method, a device manufacturing method that can manufacture a device with a capability of exhibiting a desired performance.

Means for Solving the Problems

To solve the above-described problems, the present invention adopts the following configurations that are illustrated in the embodiments corresponding to drawings. However, parenthesized reference numerals affixed to the respective elements are were examples of those elements, and they do not limit the respective elements.

According to a first aspect of the present invention, an exposure method is provided for emitting exposure light (EL) onto a substrate (P) via a liquid (LQ) to expose the substrate (P), in which a surface (1A, 1B, 1C) of a base material (1) that is used as the substrate (P) has an effective region (4) coated with a photosensitive material (2), and at least a part of the surface (1A, 1B, 1C) of the base material (1) is coated with a predetermined material (3) such that the surface (1A, 1B, 1C) of the base material (1) does not come into contact with the liquid (LQ) on an outside of the effective region (4).

According to the present invention, a predetermined region of the surface of the base material outside of the effective region coated with the photosensitive material is coated with the predetermined material to prevent contact of the base material with the liquid on the outside of the effective region. Therefore, elution of the substance constituting the surface of the base material into the liquid can be suppressed. Using a material that has little influence on the liquid as the predetermined material enables a good exposure of the substrate in the state with the liquid being retained in a desired condition.

Here, the "effective region" means an exposurable region coated with a photosensitive material. It is a region on which the pattern with a desired accuracy is formed.

According to a second aspect of the present invention, an exposure method is provided for emitting exposure light (EL) onto a substrate (P) held on a substrate holder (PH) via a liquid (LQ) to expose the substrate (P), in which the substrate holder (PH) has a flat portion (51) around the substrate (P) and an HMDS layer (7) is formed on a peripheral region of the substrate (P) to suppress leakage of a liquid (LQ) into a gap (A) between the substrate (P) held on the substrate holder (PH) and the flat portion (51).

According to present invention, the HMDS layer is formed on the peripheral region of the substrate. Therefore, in the peripheral region of the substrate, leakage of a substance from a part of the substrate (foundation of the HMDS layer) into the liquid can be suppressed. Furthermore, leakage of the liquid into the gap between the substrate and the flat portion provided therearound can be suppressed.

According to a third aspect of the present invention, a device manufacturing method is provided that uses the above-mentioned exposure method.

According to present invention, since exposure can be performed with the liquid being retained in a desired condition, devices having desirable performance can be provided.

EFFECTS OF THE INVENTION

According to the present invention, a substrate can be exposed with a liquid being retained in a desired condition, thus a device having desired performance can be manufactured.

DESCRIPTION OF SYMBOLS

1: base material, 1A: upper surface, 1B: under surface, 1C: side surface, 2: photosensitive material, 3: first material, 3': second material, 4; effective region, 5: non-effective region, 7: HMDS layer, 100: liquid immersion mechanism, EL: exposure light, EX: exposure apparatus, LQ: liquid, P: substrate

BEST MODE FOR CARRYING OUT THE INVENTION

Embodiments of the present invention will be explained as follows with reference to the drawings. It should be noted that the present invention will not be limited by the embodiments hereunder.

First Embodiment

Figure 1:
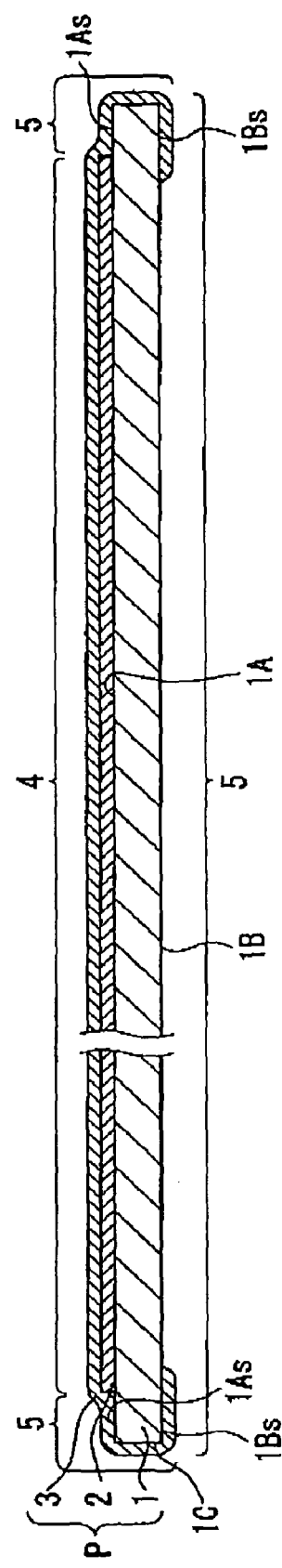
FIG. 1 is a schematic schematic view showing a substrate to be exposed according to a first embodiment.

A first embodiment will be described with reference to the drawings. FIG. 1 shows an example of a substrate P to be exposed. In FIG. 1, the substrate P has a base material 1 and a photosensitive material 2 that is coated on part of an upper surface 1A of the base material 1. In the present embodiment, the base material 1 includes a semiconductor wafer, and the substrate P is exposed by the liquid immersion method.

The photosensitive material 2 is coated on part of the upper surface 1A of the base material 1, with a thickness of, e.g., 200 nm. The surface of the base material 1 used as the substrate P has an effective region 4 coated with the photosensitive material 2 and a non-effective region 5 on the outside of the effective region 4. The non-effective region 5 on the outside of the effective region 4 includes a peripheral region 1As of the upper surface 1A of the base material 1, a side surface 1C of the base material 1, and an under surface 1B that faces the upper surface 1A. In the present embodiment, the non-effective region 5 on the outside of the effective region 4 is not coated with the photosensitive material 2. In other words, the photosensitive material 2 is not coated on the peripheral region 1As of the upper surface 1A of the base material 1, the side surface 1C of the base material 1, or the under surface 1B of the base material 1.

The peripheral region 1As of the upper surface 1A of the base material 1 (the non-effective region 5 of the upper surface 1A) has a width of, e.g., 3 mm. The effective region 4 is provided on the inside of the non-effective region 5 and occupies most of the region of the upper surface 1A of the base material 1. In other words, the photosensitive material 2 is coated on almost all of the upper surface 1A of the base material 1 except the peripheral region 1As of the upper surface 1A.

The photosensitive material 2 is coated on the base material 1 by a predetermined coating method such as a spin coat method. However, when a film of the photosensitive material 2 is formed on the base material 1 by a predetermined coating method such as a spin coat method, the photosensitive material 2 is coated also on the non-effective region 5 on the outside of the effective region 4, such as the peripheral region 1As or side surface 1C of the base material 1. If this region comes into contact with a transfer arm of a transfer system that transfers the substrate P or with a supporting portion such as a shelf of a carrier in which the substrate P is stored, the photosensitive material 2 may fall off. Having fallen off, the photosensitive material 2 may not only work as foreign matter to contaminate the transfer arm or the carrier, but also spread the contamination by coming into contact with the clean substrate P again. Furthermore, there is a case in which a film of the photosensitive material 2 is thicker in the peripheral region of the base material 1 than in the central region. The photosensitive material 2 of that peripheral region of the base material 1 is likely to fall off. Having fallen off, the photosensitive material 2 works as a foreign matter. When the foreign matter attaches to the substrate P, the accuracy of a pattern transfer is affected. To address this, after providing the photosensitive material 2 on the base material 1 by a predetermined coating method, a treatment is performed in which the photosensitive material 2 on the peripheral region 1As, the side surface 1C, or the like is removed by use of, e.g., a solvent (edge rinse treatment). This removes the photosensitive material 2 on the peripheral region 1As, etc. of the base material 1 (substrate P). In the present embodiment, the non-effective region 5 includes a region from which the photosensitive material 2 has been removed by the edge rinse treatment.

In the description below, a treatment in which a material film on the periphery region of a base material (substrate) is removed from a predetermined material film formed on the base material (substrate) is appropriately referred to as an edge rinse treatment. Furthermore, for example, when a plurality of material films are laminated on the base material, an edge rinse treatment includes removing a peripheral region of at least part of the plurality of the material films.

The effective region 4 coated with the photosensitive material 2 is an exposurable region on which a pattern with a desired accuracy can be formed. In other words, the photosensitive material 2 provided on the effective region 4 is coated under prescribed coating conditions including an environmental conditions (temperature, humidity) at the time of coating, the filming condition, the material composition, the film-thickness condition, etc., such that a pattern with a desired accuracy is formed.

The photosensitive material 2 is covered with a first material 3 that is different from the photosensitive material 2. In the present embodiment, the first material 3 forms a protective film called a topcoat film on the top layer of the photosensitive material 2. This topcoat film is a film for protecting the photosensitive material 2 from a liquid. The first material 3 for forming the topcoat film covers the effective region 4 and the non-effective region 5 on the outside of the effective region 4. To be more specific, the first material 3 covers the peripheral region 1As of the upper surface 1A of the base material 1, the side surface 1C of the base material 1, and a peripheral region 1Bs of the under surface 1B of the base material 1. In FIG. 1, the film of the first material 3 is shown with substantially the same thickness as that of the photosensitive material 2. However, in actuality, the first material 3 has a thickness of approximately 20 to 40 nm, and thus is formed thinner than the photosensitive material 2.

In the present embodiment, as for the photosensitive material 2, P6111 manufactured by TOKYO OHKA KOGYO CO., LTD. may be used, for example. As for the first material 3, TSP-3A manufactured by TOKYO OHKA KOGYO CO., LTD. may be used, for example. The photosensitive material 2 and the first material 3 have liquid-repellency to a liquid for forming a liquid immersion region at the time of immersion exposure. As will be described later in the present embodiment, pure water is used as a liquid for forming a liquid immersion region. Therefore, in such a case, a material with water-repellency is used as the photosensitive material 2 and the first material 3. For example, the contact angle of the liquid (pure water) LQ with respect to the photosensitive material 2 is 60 to 85°, and the contact angle of the liquid (pure water) with respect to the first material 3 is 90° or greater. Furthermore, the photosensitive material 2 and the first material 3 are non-soluble with the liquid LQ, and thus are materials having little influence on the liquid LQ.

The above-mentioned topcoat film is often provided to prevent the liquid in the liquid immersion region from penetrating into the photosensitive material 2. However, there are also cases in which the topcoat film is provided to prevent the liquid from remaining on the substrate P. Even if, for example, the liquid attaches onto the topcoat film and an adhesion trace (also known as a water mark) of the liquid is formed on the topcoat layer after the evaporation of the liquid, the water mark can be removed together with the topcoat film by removing the topcoat film after the liquid immersion exposure. Furthermore, after the water mark is removed together with the topcoat film, predetermined processes such as a development process can be performed.

As for the first material 3, a fluoroplastic material such as P6111 manufactured by TOKYO OHKA KOGYO CO., LTD. can be used, as described above. However, a plastic material that has a high affinity for a developer and is based on an extremely-alkaline high polymer can also be used. When the plastic material that has a high affinity for a developer and is based on an extremely-alkaline high polymer is used, the topcoat film can be washed off together with the developer, thus eliminating the need for a dedicated washing process as for a topcoat film using a fluoroplastic material. Furthermore, as for the first material 3, a hexamethyldisilazane (HMDS), which is used in a manufacturing process for semiconductors, may be employed.

As described above, the base material 1 includes a semiconductor wafer, and the surface of the base material 1 includes the surface of the silicon substrate.

Processes for forming the substrate P shown in FIG. 1 will be briefly described. First, the photosensitive material 2 is coated on the base material 1 such as a semiconductor wafer. After the coating of the photosensitive material 2, the edge rinse treatment is performed in which the photosensitive material 2 of the peripheral region 1As of the base material 1 is removed. After the edge rinse treatment, the topcoat film (layer) made of the first material 3 such as the above-described fluoroplastic material or HMDS is formed so as to cover the photosensitive material 2. The film (layer) made of the first material 3 is formed also on the portion, of the peripheral region 1As of the base material 1, that has been subjected to the edge rinse treatment. After the substrate P is subjected to predetermined processes such as a prebake process, an exposure process is performed.

Next, an exposure apparatus EX that exposes the above-described substrate P by the liquid immersion method will be described with reference to FIG. 2.

Figure 2:
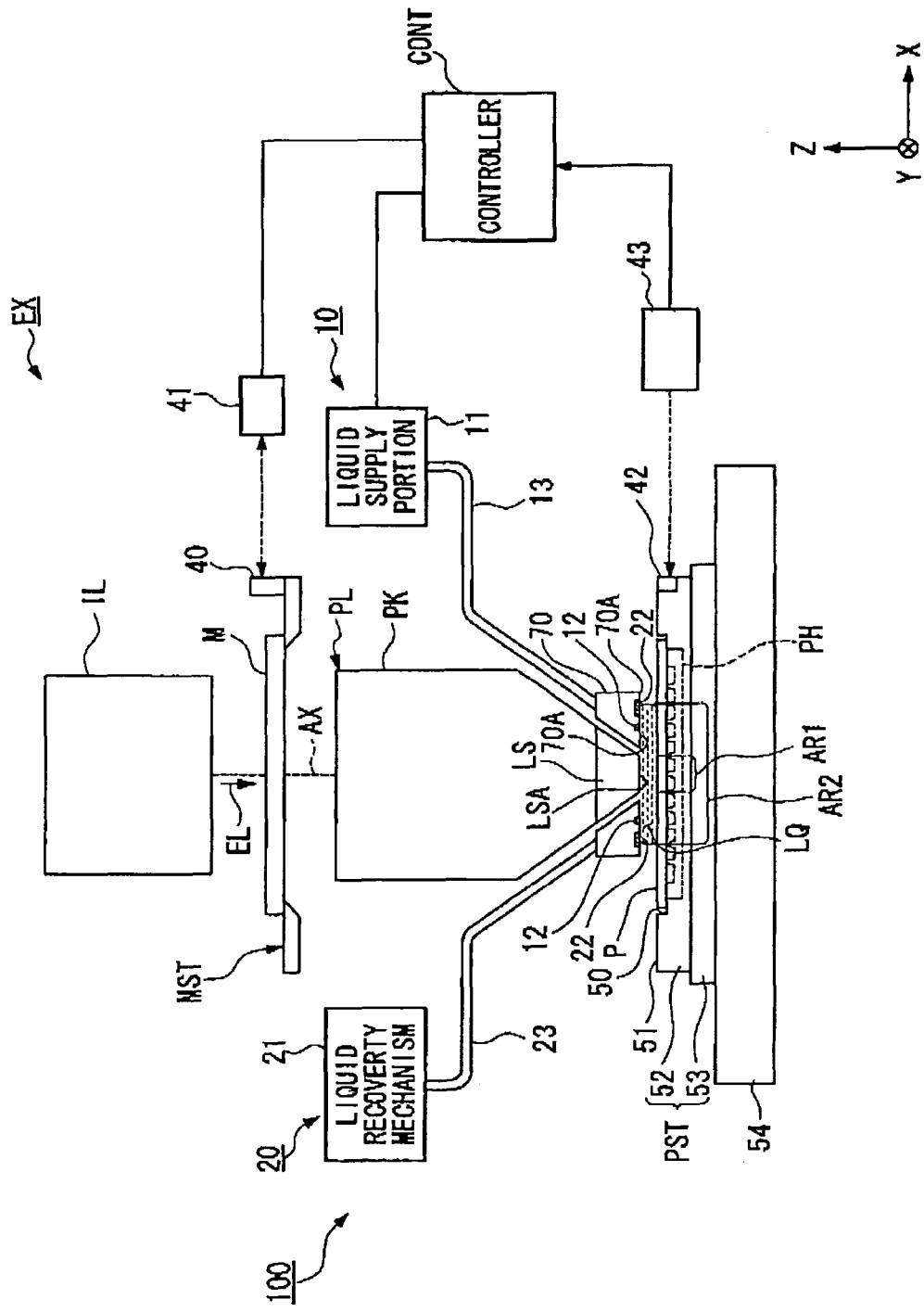
FIG. 2 is a schematic diagram showing an embodiment of an exposure apparatus.

In FIG. 2, the exposure apparatus EX includes: a mask stage MST that is movable while supporting a mask M; a substrate stage PST that has a substrate holder PH for holding a substrate P and that is movable in the state with the substrate P being held by the substrate holder PH; an illumination optical system IL that illuminates the mask M supported by the mask stage MST with an exposure light EL; a projection optical system PL that projects a pattern image of the mask M illuminated with the exposure light EL onto the substrate P supported by the substrate stage PST; and a controller CONT that controls the overall operation of the exposure apparatus EX. The "mask" here includes a reticle formed with a device pattern which is reduced in size and projected onto the substrate P.

The illumination optical system IL is for illuminating the mask M supported by the mask stage MST with the exposure light EL and has an exposure light source, an optical integrator for uniforming the illuminance of the light flux emitted from the exposure light source, a condenser lens for condensing the exposure light EL from the optical integrator, a relay lens system, a field stop for setting an illumination area on the mask M formed by the exposure light, etc. A predetermined illumination area on the mask M is illuminated, by the illumination optical system IL, with the exposure light EL having a uniform illuminance distribution. For the exposure light EL emitted from the illumination optical system IL, emission lines (g line, h line, i line) emitted, for example, from a mercury lamp, deep ultraviolet beams (DUV light beams) such as the KrF excimer laser beam (wavelength: 248 mm), and vacuum ultraviolet light beams (VUV light beams) such as the ArF excimer laser beam (wavelength: 193 nm), and the $F_2$ laser beam (wavelength: 157 nm), etc. may be used. In the present embodiment, an ArF excimer laser light is used.

The mask stage MST is movable while holding the mask M and is two-dimensionally movable in a plane perpendicular to the optical axis AX of the projection optical system PL, i.e., in the XY-plane, and is finely rotatable in the θZ direction. On the mask stage MST, a movement mirror 40 is provided for a laser interferometer 41 for measuring a position of the mask stage MST. The two-dimensional position and the rotation angle of the mask M on the mask stage MST are measured by the laser interferometer 41 in real time. The controller CONT drives a mask stage driving mechanism including a linear motor, etc. based on the measurement results from the laser interferometer 41 to position the mask M supported by the mask stage MST.

The projection optical system PL projects and exposes a pattern image formed on the mask M onto the substrate P at a predetermined projection magnification β, and is constituted by a plurality of optical elements including an optical element (lens) LS disposed at the front end portion directed toward the substrate P. These optical elements are supported in a lens barrel PK. In the present embodiment, the projection optical system PL is a reduction system of which the projection magnification β is, e.g., ¼, ⅕, or ⅛. The projection optical system PL may be an equal system or a magnification system. Furthermore, the projection optical system PL may be one of: a refractive system which does not include a reflection element, a reflection system which does not include a refractive element, and a cata-dioptric system which includes a refractive element and a reflection element. The optical element LS at the front end portion is exposed from the lens barrel PK.

The substrate stage PST includes: a Z stage 52 that holds the substrate P via the substrate holder PH; and an XY stage 53 that supports the Z stage 52. The XY stage 53 is supported on a base 54. The Z stage 52 can move the substrate P held on the substrate holder PH in the Z-axis direction and in the θX and θY directions (inclination directions). The XY stage 53 can move the substrate P held on the substrate holder PH in the XY directions (directions substantially parallel to the image plane of the projection optical system PL) and in the θZ direction via the Z stage 52. Obviously, the Z stage and the XY stage may be integrally provided.

On the substrate stage PST (Z stage 52) a movement mirror 42 is provided for a laser interferometer 43 for measuring a position of the substrate stage PST. The two-dimensional position and the rotation angle of the substrate P on the substrate stage PST are measured by the laser interferometer 43 in real time. The controller CONT drives, in the two-dimensional coordinate system defined by the laser interferometer 43, the XY stage 53 via a substrate stage driving mechanism including a linear motor, etc. based on the measurement results from the laser interferometer 43, to position the substrate P supported by the substrate stage PST in the X-axis and Y-axis directions.

Furthermore, the exposure apparatus EX includes a focus detection system, as disclosed in Japanese Unexamined Patent Publication, First Publication No. H08-37149, that projects a detection light obliquely onto the upper surface of the substrate P to detect the plane position information of the upper surface of the substrate P. The focus detection system can determine the position, in the Z-axis direction, of the upper surface of the substrate P with respect to the image plane of the projection optical system PL (focus position) and the inclination of the upper surface of the substrate P. The controller CONT drives the Z stage 52 of the substrate stage PST via the substrate stage driving mechanism to control the position in the Z-axis direction (focus position) and position in the θX and θY directions of the substrate P held on the Z stage 52, thus making the upper surface (exposure surface) of the substrate P coincide with the image plane formed via the projection optical system PL and the liquid LQ.

The exposure apparatus EX of the present embodiment is an immersion exposure apparatus applied with a liquid immersion method for substantially shortening the exposure wavelength and improving the resolution, and also substantially expanding the depth of focus. It includes a liquid immersion mechanism 100 that can form a liquid immersion region AR2 of the liquid LQ on the substrate P. The liquid immersion mechanism 100 is provided above the substrate P (substrate stage PST), and includes: an annular nozzle member 70 provided so as to surround an optical element LS at the front end of the projection optical system PL; a liquid supply mechanism 10 that supplies the liquid LQ onto the substrate P via liquid supply ports 12 provided in the nozzle member 70; and a liquid recovery mechanism 20 that recovers the liquid LQ on the substrate P via liquid collection ports 22 provided in the nozzle member 70. The liquid supply mechanism 10 supplies the predetermined liquid LQ onto the image plane facing the projection optical system PL. The liquid supply mechanism 10 includes: a liquid supply portion 11 that can deliver the liquid LQ; and a supply pipe 13, one end of which is connected to the liquid supply portion 11. The other end of the supply pipe 13 is connected to the nozzle member 70. The liquid supply portion 11 includes a tank that stores the liquid LQ, a pressurizing pump, and a filter unit, etc. The liquid recovery mechanism 20 recovers the liquid LQ on the image plane facing the projection optical system PL. The liquid recovery mechanism 20 includes: a liquid recovery portion 21 that can recover the liquid LQ; and a recovery pipe 23, one end of which is connected to the liquid recovery portion 21. The other end of the recovery pipe 23 is connected to the nozzle member 70. The liquid recovery portion 21 includes, for example, a vacuum system (suction apparatus) such as a vacuum pump, a gas-liquid separator that separates the gas from the recovered liquid LQ, and a tank that stores the recovered liquid LQ, etc.

The nozzle member 70 is provided above the substrate P (substrate stage PST). An under surface 70A of the nozzle member 70 faces the upper surface of the substrate P. The liquid supply ports 12 are provided in the under surface 70A of the nozzle member 70. Inside the nozzle member 70 an internal passage is provided that connects the supply pipe 13 and the liquid supply ports 12. The liquid collection ports 22 are also provided in the under surface 70A of the nozzle member 70, on the outside of the supply ports 12 with respect to an optical axis AX of the projection optical system PL (optical element LS). Furthermore, inside the nozzle member 70 an internal passage is provided that connects the recovery pipe 23 and the liquid collection ports 22.

The operation of the liquid supply portion 11 is controlled by the controller CONT. When supplying the liquid LQ onto the substrate P, the controller CONT delivers the liquid LQ from the liquid supply portion 11, and supplies the liquid LQ, via the supply pipe 13 and the internal passages of the nozzle member 70, onto the substrate P from the liquid supply ports 12 provided above the substrate P. The liquid recovery operation of the liquid recovery portion 21 is controlled by the controller CONT. The controller CONT can control the per-unit-time liquid recovery amount by the liquid recovery portion 21. The liquid LQ on the substrate P having recovered from the liquid collection ports 22 provided above the substrate P is recovered into the liquid recovery portion 21 via the internal passages of the nozzle member 70 and the recovery pipe 23.

The controller CONT, at least while transferring the pattern image of the mask M onto the substrate P, uses the liquid LQ supplied from the liquid supply mechanism 10 to form a liquid immersion region AR2 locally on at least part of the substrate P including a projection region AR1 of the projection optical system PL such that the liquid immersion region A2 is larger than the projection region AR1 and smaller than the substrate P. More specifically, the exposure apparatus EX fills space between an optical element LS at the front end portion on the image plane side of the projection optical system PL and the upper surface (exposure surface) of the substrate P with the liquid LQ to form the liquid immersion region AR2, and projects, via the liquid LQ between the projection optical system PL and the substrate P as well as the projection optical system PL, a pattern image of the mask M onto the substrate P, thus exposing the substrate P.

In the present embodiment, pure water is used for the liquid LQ for forming the liquid immersion region AR2. Pure water can transmit an ArF excimer laser beam even if it is used as the exposure light EL. Pure water can also transmit emission lines (g-line, h-line, i-line) and deep ultraviolet beams (DUV light beams) such as the KrF excimer laser beam (wavelength: 248 nm).

An under surface LSA of the optical element LS of the projection optical system PL and the under surface 70A of the nozzle member 70 are flat. Furthermore, the under surface LSA of the optical element LS of the projection optical system PL and the under surface 70A of the nozzle member 70 are substantially flush with each other. A recess portion 50 is provided on the substrate stage PST (Z stage 52), and the substrate holder PH is placed in the recess portion 50. The upper surface 51 other than the recess portion 50 of the substrate stage PST is flat such that it is at substantially the same height as (flush with) the upper surface of the substrate P held on the substrate holder PH. As a result, the liquid immersion region AR2 can be desirably formed between the under surface 70A of the nozzle member 70 as well as the under surface LSA of the optical element LS and the substrate P (substrate stage PST). Furthermore, providing the upper surface 51 serves to desirably form the liquid immersion region AR2 because the liquid LQ is retained on the image plane facing to the projection optical system PL even when the peripheral region of the substrate P is immersion exposed.

A liquid contact surface (including the under surface LSA), of the surface of the optical element LS, that comes into contact with the liquid LQ of the liquid immersion region AR2 has lyophilicity to the liquid LQ. A liquid contact surface (including the under surface 70A), of the nozzle member 70, that comes into contact with the liquid LQ of the liquid immersion region AR2 also has lyophilicity to the liquid LQ. To make the above-mentioned liquid contact surfaces of the optical element LS and the nozzle member 70, in the present embodiment, a lyophilic treatment is performed in which, for example, a lyophilic material such as $MgF_2$, $Al_2O_3$, or $SiO_2$ is coated on the liquid contact surfaces. On the other hand, the upper surface 51 of the substrate stage PST has liquid-repellency to the liquid LQ. To make the upper surface 51 of the substrate stage PST, in the present embodiment, a liquid-repellent treatment is performed in which, for example, liquid-repellent material such as a fluoroplastic material or an acrylic plastic material is coated on the upper surface 51 of the substrate stage PST. A material used here for coating the optical element LS, the nozzle member 70, and the substrate stage PST, etc. is non-soluble to the liquid LQ. As described above, the material coated on the base material 1 constituting the substrate P has liquid-repellency to the liquid LQ. Therefore, the upper surface of the substrate P also has liquid-repellency to the liquid LQ. The liquid immersion region AR2 can be retained in a good condition, and also, the occurrence of an undesirable remnant of the liquid LQ can be prevented on the upper surface of the substrate P or on the upper surface 51 of the substrate stage PST since the upper surface of the substrate P and the upper surface 51 of the substrate stage PST are made liquid-repellent.

In the present embodiment, the upper surface of the substrate P refers to the surface of the topmost material film of the material films coated on the upper surface 1A of the base material 1. For example, in the example shown in FIG. 1, the upper surface of the substrate P refers to the surface of the film formed by the first material 3. In a form in which the first material 3 is not coated on the photosensitive material 2, the upper surface of the substrate P includes the surface of the film formed by the photosensitive material 2.

Figure 3:
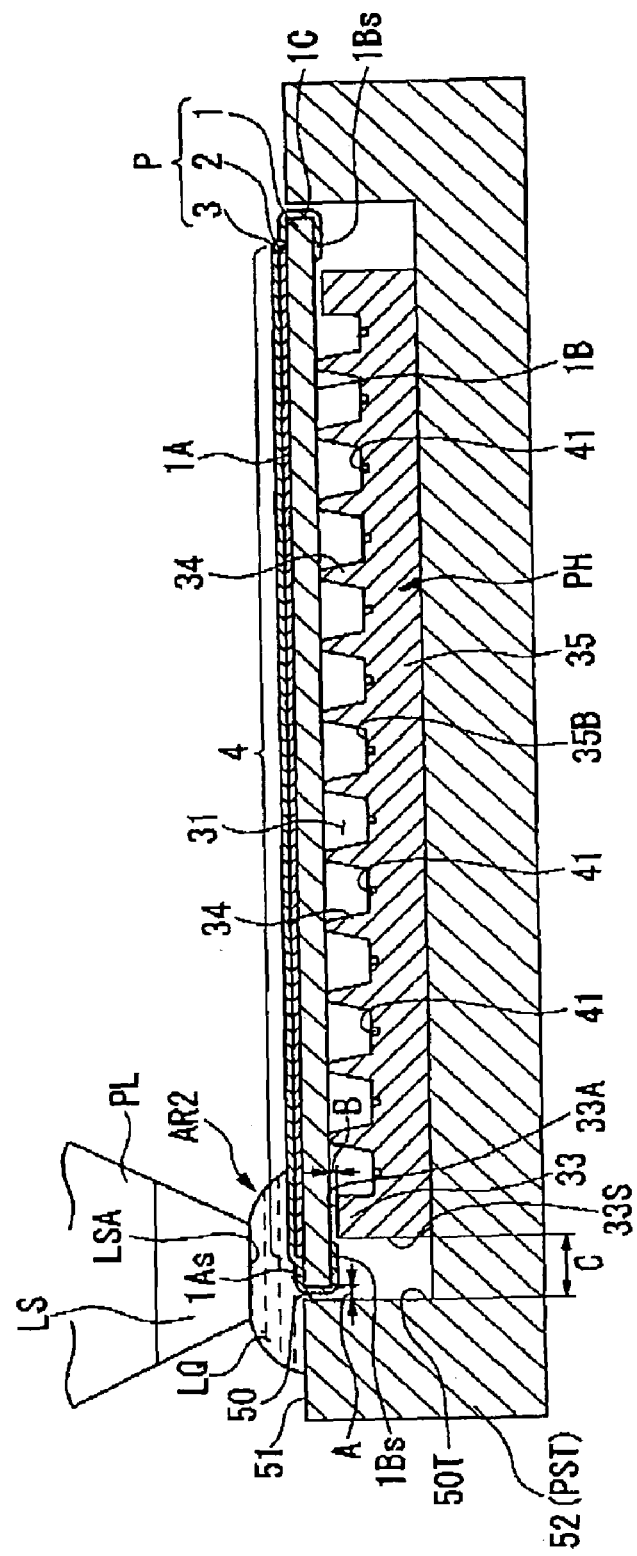
FIG. 3 is a cross-sectional view showing a substrate stage holding a substrate.

FIG. 3 is an enlarged cross-sectional view showing the vicinity of the substrate holder PH holding the substrate P. In FIG. 3, the substrate holder PH includes: a base member 35 that has a bottom surface 35B facing, at a predetermined distance apart, the under surface 1B of the base material 1 constituting the substrate P; a peripheral wall 33 that is formed on the base member 35 and has an upper surface 33A facing the under surface 1B of the base material 1; and supporting portions 34 formed on the bottom surface 35B inside the peripheral wall 33. The peripheral wall 33 is formed in a substantially annular shape in accordance with the shape of the substrate P. The upper surface 33A of the peripheral wall 33 is formed so as to face a peripheral region 1Bs of the under surface 1B of the base material 1. The upper surface 33A of the peripheral wall 33 is flat.

A plurality of the supporting portions 34 of the substrate holder PH are provided uniformly on the inside of the peripheral wall 33. In the present embodiment, the supporting portions 34 of the substrate holder PH include a plurality of supporting pins, and thus the substrate holder PH constitutes a structure known as a pin chuck structure. The pin chuck structure includes a suction mechanism having suction ports 41 that negatively pressurizes the space 31 surrounded by the base member 35 of the substrate holder PH, the peripheral wall 33 of the substrate holder PH, and the substrate P. It suctions and supports the substrate P on the supporting portions 34 by negatively pressurizing the space 31. In FIG. 3, a plurality of the suction ports 41 are provided uniformly in the bottom surface 35B of the base member 35.

A gap (space) C with a predetermined distance is provided between an inner side surface 50T formed by the recess portion 50 of the Z stage 52 (substrate stage PST) and an outer side surface 33S of the peripheral wall 33. Formed between an edge portion of the substrate P held by the substrate holder PH and the upper surface 51 of the Z stage 52 (substrate stage PST) provided around the substrate P is a gap A with a distance of approximately 0.1 to 1.0 mm. In the present embodiment, the gap A is approximately 0.3 mm. The outer diameter of the peripheral wall 33 is formed smaller than that of the substrate P, and the gap C is larger than the gap A, for example, 1.5 mm.

In the present embodiment, the upper surface 33A of the peripheral wall 33 is flat. The upper surface 33A is coated with a liquid-repellent material such as a fluoroplastic material in order to have liquid-repellency. Furthermore, in the present embodiment, the outer side surface 33S of the peripheral wall 33 of the substrate holder PH and the inner side surface 50T of the Z stage 52 are also coated with the liquid-repellent material in order to have liquid-repellency. The surface of the base member 35 including the surface of the supporting portions 34 and the bottom surface 35B also has liquid-repellency.

The method for exposing the substrate P using the exposure apparatus EX having the above configuration will be explained in the next place.

The liquid immersion method is applied in the present embodiment in which the substrate P is exposed by emitting the exposure light EL onto the substrate P via the projection optical system PL and the liquid LQ. Thus, when the mask M is projected onto the substrate P, the pattern image of the mask M is projected onto the effective region 4 on the substrate P. As described above, the effective region 4 is provided with the photosensitive material 2 coated in a predetermined condition such that a pattern with a predetermined accuracy can be formed. Therefore, a device pattern with a desired accuracy can be formed onto the base material 1 in the effective region 4 by projecting the pattern image of the mask M onto the effective region 4.

When the pattern image of the mask M is projected onto the peripheral region of the effective region 4 or when the liquid immersion region AR2 is moved onto the upper surface 51 of the substrate stage PST, there is the possibility that the liquid immersion region AR2 is located over the gap A, as shown in FIG. 3. In the present embodiment, the gap A is set to be the above-mentioned predetermined value (approximately 0.1 to 1.0 mm). Furthermore, the regions that form the gap A, that is, the inner side surface 50T of the Z stage 52 and the side surface (the first material 3 coating the side surface 1C of the base material 1) of the substrate P that faces the inner side surface 50T are liquid-repellent. Therefore, penetration of the liquid LQ from the gap A can be securely prevented.

In the condition as shown in FIG. 3 etc., the liquid LQ of the liquid immersion region AR2 comes into contact with the peripheral region of the upper surface of the substrate P. However, the peripheral region 1As of the upper surface 1A of the base material 1 on the outside of the effective region 4 is coated with the first material 3 such that the peripheral region 1As of the upper surface 1A of the base material 1 does not come into contact with the liquid LQ. Therefore, the liquid LQ does not come into contact with the base material 1. Even if a small quantity of the liquid LQ penetrates into the gap A, the liquid LQ does not come into contact with the base material 1, since the side surface 1C on the outside of the effective region 4 of the base material 1 is coated with the first material 3 to prevent contact of the side surface 1C with the liquid LQ. Furthermore, even if flow of the liquid LQ coming in through the gap A finds its way beneath the under surface of the substrate P, the liquid LQ does not come into contact with the base material 1; since part of the under surface 1B (peripheral region 1Bs) of the base material 1 is coated with the first material 3.

There is the possibility that flow of the liquid LQ coming in through the gap A flows into a first space 31 that is formed between the upper surface 33A of the peripheral wall 33 and the under surface 1B of the base material 1. Although, in FIG. 3, the first material 3 is coated on the peripheral region 1Bs of the under surface 1B, the region of the under surface 1B of the base material 1 that faces the upper surface 33A of the peripheral wall 33 of the substrate holder PH is not coated with the first material 3. To address this, coating the region of the under surface 1B of the base material 1 that faces the upper surface 33A of the peripheral wall 33 of the substrate holder PH with the first material 3 so as to impart liquid-repellency can prevent flow of the liquid LQ from coming in though the gap B that is formed between the upper surface 33A of the peripheral wall 33 and the under surface 1B of the base material 1. Obviously, the entire region of the under surface 1B of the base material 1 can be coated with the first material 3. Note that, as shown in FIG. 3, even if the region of the under surface 1B of the base material 1 that faces the upper surface 33A of the peripheral wall 33 of the substrate holder PH is not coated with the first material 3, penetration of the liquid LQ into the first space 31 through the gap B can be prevented by adjusting the gap B.

As described above, elution of the substance constituting the surface of the base material 1 into the liquid LQ can be suppressed since a predetermined region of the surface of the base material 1 on the outside of the effective region 4 coated with the photosensitive material 2 is coated with the first material 3 such that the surface of the base material 1 including the upper surface 1A, the side surface 1C, and the under surface in do not come into contact with the liquid LQ on the outside of the effective region 4. In the present embodiment, when the surface of the base material 1 comes into contact with the liquid LQ, the substance (Si) forming the silicon substrate may elute into the liquid LQ. The substance eluted into the liquid LQ acts as an impurity. For example, if the liquid LQ including the impurity penetrates into the base material 1, a functional layer having been provided on the base material 1 for forming a device may be affected. As a result, there may occur undesirable situations such as deterioration in performance of the device to be formed and a formation of a water mark on the optical measurement portion because the liquid LQ including the impurity remains on an optical measurement portion (not shown in the figure) provided on the substrate stage PST and the liquid LQ then vaporizes there. In the present embodiment, the first material 3 is coated on the region, of the base material 1, on the outside of the effective region 4 on which the photosensitive material 2 is coated so that the base baterial 1 does not make contact with the liquid LQ. As a result, the occurrence of the above undesirable situations can be prevented. Furthermore, by using a material having little influence on the liquid LQ as the first material 3 that comes into contact with the liquid LQ, the substrate P can be favorably exposed with the liquid LQ of the liquid immersion region AR2 being retained in a desired condition.

In the above embodiment, the case where the film made of the photosensitive material 2 is formed on the silicon substrate, that is, the surface of the base material 1 on the outside of the effective region 4 is the surface of the silicon substrate, is described so as to be a simplified description. However, the surface (foundation) of the base material 1 may be an oxide film of $SiO_2$, etc. Furthermore, the surface (foundation) of the base material 1 on the outside of the effective region 4 may be an oxide film of $SiO_2$, etc, an insulating film of $SiO_2$, SiNx, etc., a metal/conductive film of Cu, Al—Si, etc., or a semiconductor film of amorphous Si, etc. that has been generated in the previous processes, or a mixture of these. In any cases, when the surface comes into contact with the liquid LQ that forms the liquid immersion region AR2, a substance such as metal (e.g., Si) may be eluted, as an impurity, into the liquid LQ. However, such elution of an impurity can be prevented by covering the region on the outside of the effective region 4 with the first material 3 as described in the previous embodiment.

Second Embodiment

Figure 4:
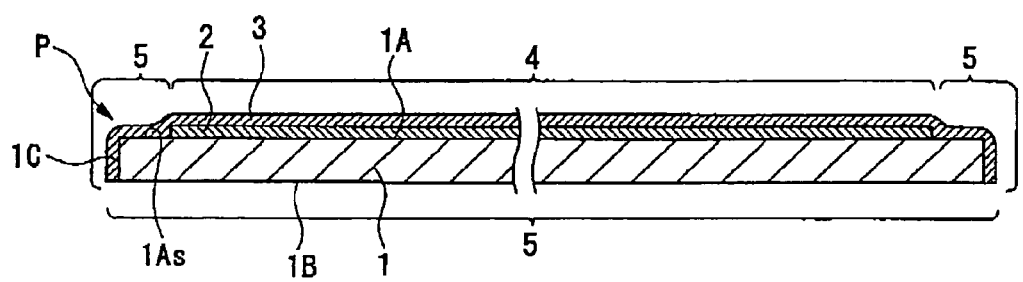
FIG. 4 is a schematic diagram showing a substrate according to a second embodiment.

In the above embodiment, the first material 3 is respectively coated on the upper surface 1A, under surface 1B, and side surface 1C of the base material 1. However, as shown in FIG. 4, it may be coated not on the under surface 1B, but only on the upper surface 1A and side surface 1C of the base material 1.

In the present embodiment, too, the photosensitive material 2 is removed from the peripheral region of the substrate P by the edge rinse treatment. After the edge rinse treatment, a film (layer) made of the first material 3 is formed on the region subjected to the edge rinse treatment.

Third Embodiment

Figure 5:
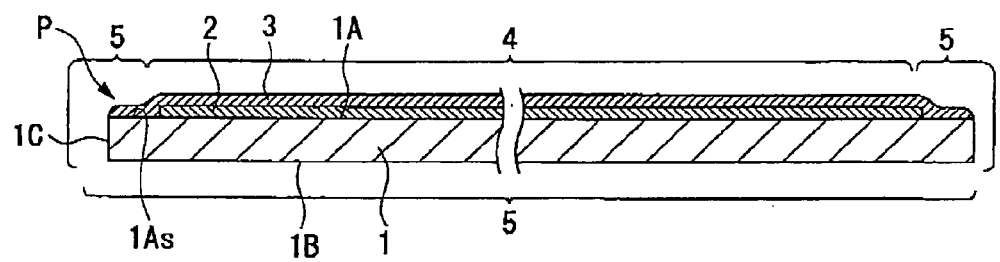
FIG. 5 is a schematic block diagram showing a substrate according to a third embodiment.

As shown in FIG. 5, the first material 3 may be coated not on the under surface 1B and side surface 1C of the base material 1, but only on the upper surface 1A including the peripheral region 1As of the base material 1.

In the present embodiment, too, the photosensitive material 2 is removed from the peripheral region of the substrate P by the edge rinse treatment. After the edge rinse treatment, a film (layer) made of the first material 3 is formed on the region subjected to the edge rinse treatment.

Fourth Embodiment

Figure 6:
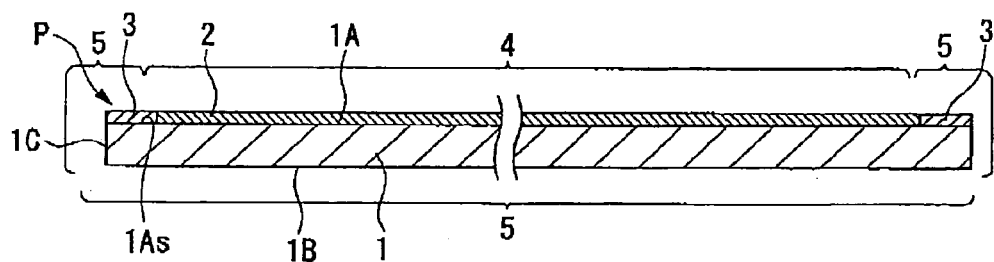
FIG. 6 is a schematic block diagram showing a substrate according to a fourth embodiment.

In the above embodiments, the first material 3 covers the photosensitive material 2 coated on the effective region 4. However, as shown in FIG. 6, the first material 3 may coat not on the photosensitive material 2 but only on the peripheral region 1As, of the upper surface 1A of the base material 1, on the outside of the effective region 4. By using a material having little influence on the liquid LQ as the photosensitive material 2 that comes into contact with the liquid LQ, the substrate P can be favorably exposed so that the liquid LQ of the liquid immersion region AR2 is retained in a desired condition. In this case, too, not only the peripheral region 1As, of the upper surface 1A of the base material 1, on the outside of the effective region 4, but also at least one of the side surface 1C and the under surface 1B may be coated.

Similarly, in the present embodiment, the photosensitive material 2 is removed from the peripheral region of the substrate P by the edge rinse treatment. After the edge rinse treatment, a film (layer) made of the first material 3 is formed on the region subjected to the edge rinse treatment.

Fifth Embodiment

Figure 7:
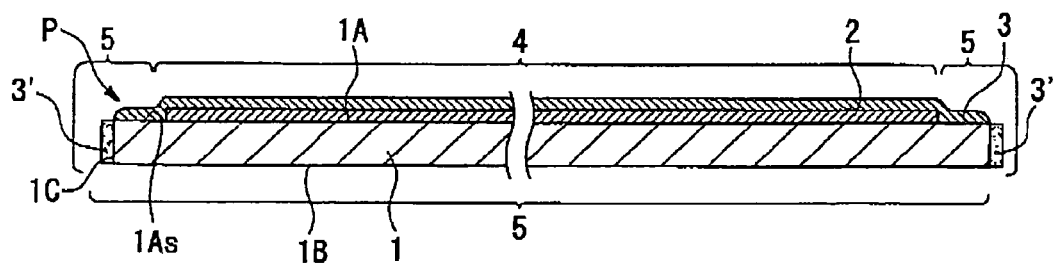
FIG. 7 is a schematic block diagram showing a substrate according to a fifth embodiment.

As for a predetermined material for coating the surface of the base material 1, a second material 3' different from the first material 3 may be coated in addition to the first material 3. In the example shown in FIG. 7, the first material 3 is coated on the upper surface 1A of the base material 1, and the second material 3' is coated on the side surface 1C. For example, one of the first material 3 and the second material 3' may be a fluoroplastic material; the other may be an HMDS. Obviously, materials to be coated on the non-effective region 5 on the outside of the effective region 4 are not limited to two types (i.e., the first and second materials 3, 3'), but plural types of any material may be coated on the non-effective region 5.

Similarly, in the present embodiment, the photosensitive material 2 is removed from the peripheral region of the substrate P by the edge rinse treatment. After the edge rinse treatment, a film (layer) made of the first material 3 or the second material 3' is formed on the region subjected to the edge rinse treatment.

Sixth Embodiment

Figure 8:
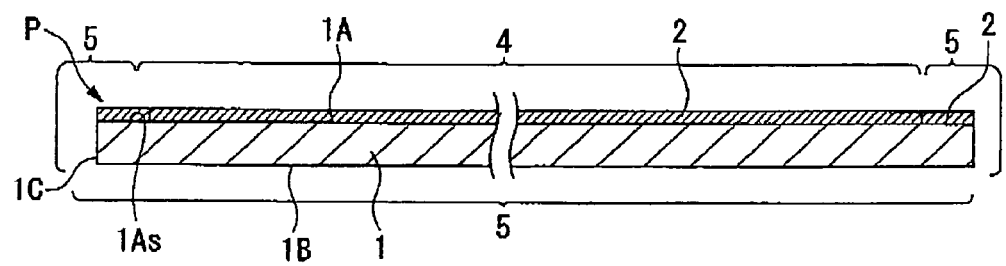
FIG. 8 is a schematic block diagram showing a substrate according to a sixth embodiment.

As for a material to be coated on the region an the outside of the effective region 4, the photosensitive material 2 that is coated on the effective region 4 may be used. For example, as shown in FIG. 8, the photosensitive material 2 can be coated on the entire region of the upper surface 1A of the base material 1 including the peripheral region 1As. In FIG. 8, when the photosensitive material 2 is coated on the effective region 4 and on the non-effective region 5 on the outside of the effective region 4 (peripheral region 1As), the photosensitive material 2 may be coated on the effective region 4 and the non-effective region 5 substantially at the same time in the same process. Alternatively, the photosensitive material 2 may be coated in separate processes in which the photosensitive material 2 is first coated on either one of the effective region 4 and the non-effective region 5 and is then coated on the other. When the photosensitive material 2 is coated not only on the effective region 4 but also on the non-effective region 5, the above coating condition in which the photosensitive material 2 is coated on the effective region 4 and the above condition in which the photosensitive material 2 is coated on the non-effective region 5 may be different from each other.

Seventh Embodiment

Figure 9:
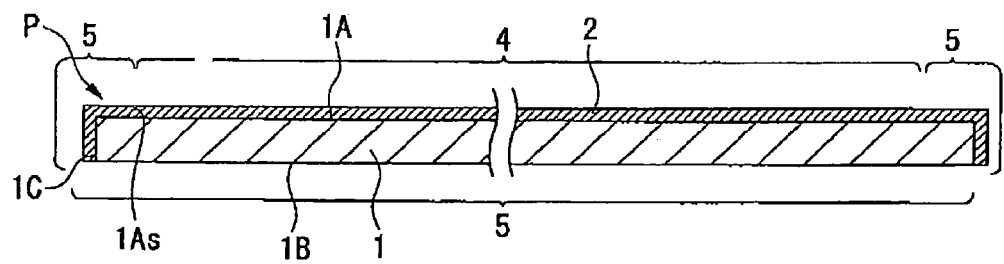
FIG. 9 is a schematic block diagram showing a substrate according to a seventh embodiment.

As shown in FIG. 9, the photosensitive material 2 may be coated on the side surface 1C of the base material 1. Furthermore, the photosensitive material 2 may be coated on the under surface 1B of the base material 1.

Eighth Embodiment

As described in the above first to fifth embodiments, a film (layer) containing a fluoroplastic material, or an HMDS, etc. is formed on the peripheral region (including the peripheral region of the upper surface and the side surface) of the substrate P. As a result, as described with reference to FIG. 3, etc, when the substrate P is held on the substrate holder PH of the substrate stage PST, not only can elution of a substance of the base material 1 into the liquid LQ be suppressed, but also leakage of the liquid LQ into the gap A between the substrate P and the upper surface 51 of the substrate stage PST provided therearound can be suppressed. Since flow of the liquid LQ which is through the gap A between the substrate P and the substrate stage PST, onto the under surface of the substrate P is suppressed, the occurrence of undesirable situations can be prevented such as where the substrate holder PH cannot favorably hold the substrate P due to wetness on the under surface of the substrate P, or where, in carrying out (unloading) the substrate P from the substrate holder PH by use of a predetermined transfer system, the transfer system, which holds the wet under surface of the substrate P, cannot favorably hold the substrate P.

An HMDS, which is relatively inexpensive, is used to improve the contact between the base material 1 such as a semiconductor wafer and the photosensitive material 2 in a manufacturing process for semiconductors. It enables effective use of the existing equipment. Furthermore, since an HMDS has liquid-repellency (water-repellency), the liquid immersion region AR2 can be favorably formed on the substrate P by forming a layer made of an HMDS (hereinafter, referred to as an HMDS layer) on the upper surface of the substrate P. Forming an HMDS layer on the upper surface of the substrate P can suppress the occurrence of undesirable situations such as the presence of a remnant of the liquid LQ or formation of an adhesion trace (water mark) of the liquid LQ on the substrate P. Furthermore, since an HMDS is generally vaporized in an HMDS treatment, an HMDS layer can be formed also on the side surface and under surface of the base material 1 (substrate P) with relative ease. Forming an HMDS layer on the side surface and under surface (backside) of the substrate P can suppress the occurrence of undesirable situations such as leakage of the liquid LQ into the gap A between the substrate P held on the substrate holder PH and the upper surface 51 of the substrate stage PST, or the liquid LQ finding its way onto the under surface of the substrate P.

In the first to fifth embodiments above, the photosensitive material 2 is formed on the base material 1 and the edge rinse treatment is performed. Although the HMDS layer is then formed on the base material 1 (substrate P) including the region subjected to the edge rinse treatment, the HMDS layer can be formed on the upper surface, side surface, and at least a part of the under surface of the base material 1 before the edge rinse treatment, or even before the film of the photosensitive material 2 is formed on the base material 1.

Figure 10:
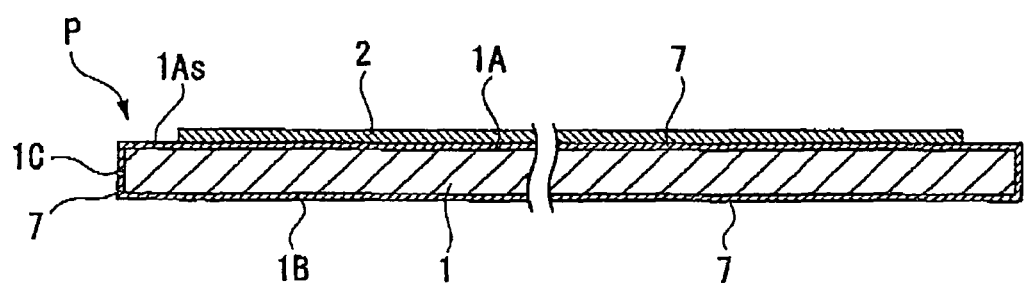
FIG. 10 is a schematic block diagram showing a substrate according to an eighth embodiment.

FIG. 10 shows a substrate P according to the present embodiment. In FIG. 10, the substrate P includes: a base material 1; and an HMDS layer 7 that is formed on an upper surface 1A, under surface 1B, and side surface 1C of the base material 1. A film of a photosensitive material 2 is formed on most of the region of the upper surface 1A of the base material 1, except on a peripheral region 1As. Accordingly, the film of the photosensitive material 2 is not formed on the peripheral region 1As of the upper surface 1A of the base material 1, the side surface 1C of the base material 1, and the under surface 1B of the base material 1.

In the present embodiment, the upper surface of the substrate P refers to the surface (exposed surface) of the topmost material film of the material films coated on the upper surface 1A of the base material 1. Therefore, in the example shown in FIG. 10, the upper surface of the substrate P includes: the surface of the film formed by the photosensitive material 2; and the surface of the HMDS layer 7 provided therearound. In the present embodiment, the under surface of the substrate P refers to the surface (exposed surface) of the topmost material film of the material films coated on the under surface 1B of the base material 1. Therefore, in the example shown in FIG. 10, the under surface of the substrate P is the surface of the HMDS layer 7. In the present embodiment, the side surface of the substrate P refers to the surface (exposed surface) of the topmost material film of the material films coated on the side surface 1C of the base material 1. Therefore, in the example shown in FIG. 10, the side surface of the substrate P is the surface of the HMDS layer 7.

Figure 11:
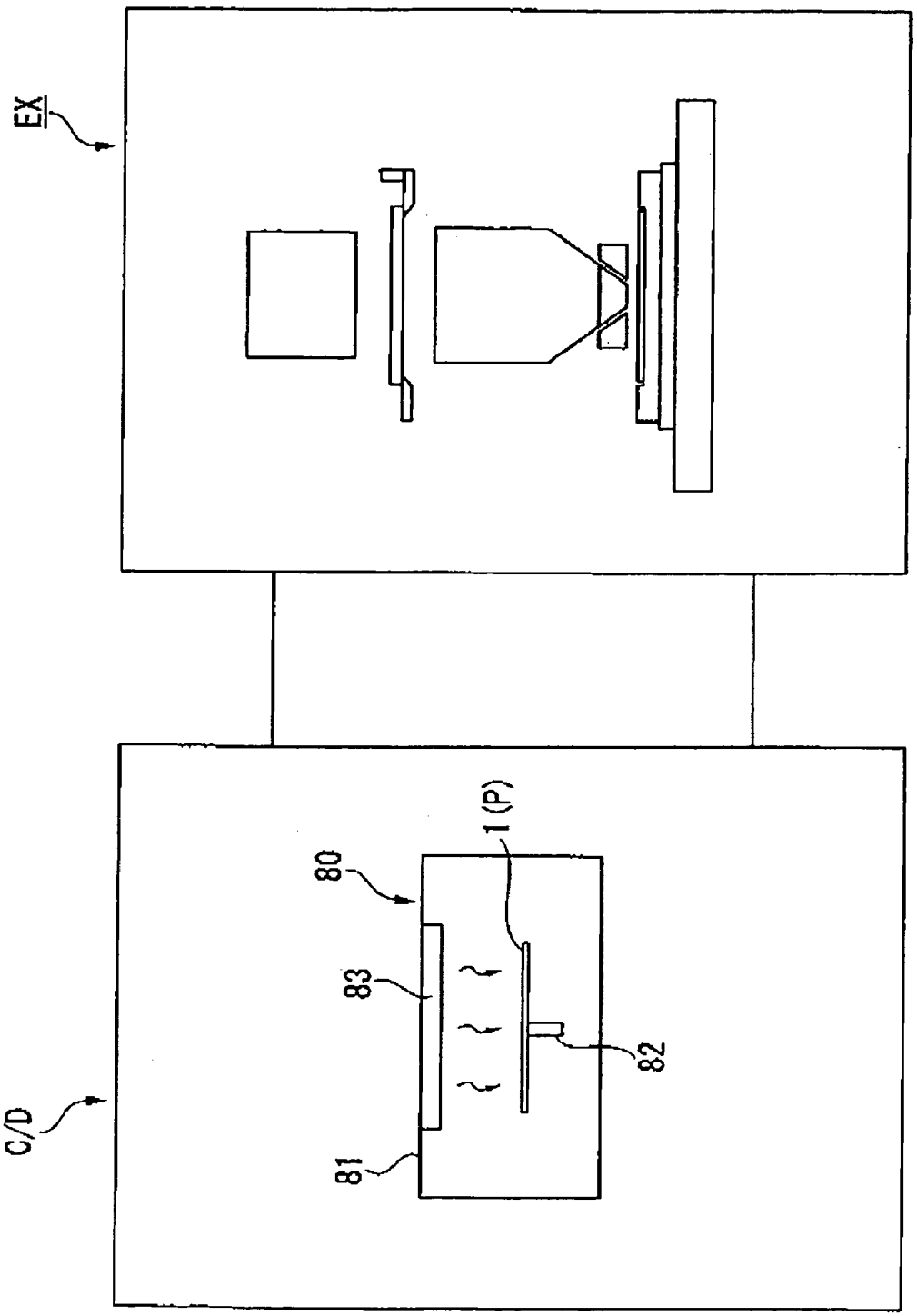
FIG. 11 is a schematic diagram for explaining an apparatus that performs an HMDS treatment.

FIG. 11 is a diagram schematically showing an example of a film forming apparatus 80 that forms an HMDS layer on a base material 1. In FIG. 11, a coater/developer C/D is connected to an exposure apparatus EX. The coater/developer C/D includes a coater that coats a photosensitive material 2 on the base material 1 and a developer that develops a substrate P after the exposure process. The film forming apparatus 80 is provided to the coater/developer C/D. The film forming apparatus 80 includes: a sealed chamber 81; a holding apparatus 82 that is provided inside the sealed chamber 81 for holding the base material 1; and a gas supply apparatus 83 that supplies a gaseous HMDS to the inside of the sealed chamber 81. The holding apparatus 82 can heat the base material 1 that is held thereon. The film forming apparatus 80 supplies the gaseous HMDS from the gas supply apparatus 83 to the inside of the sealed chamber 81 with the base material 1 heated and held on the holding apparatus 82. This brings the surface of the base material 1 into contact with the gaseous HMDS and forms an HMDS layer 7 on the surface of the base material 1. As shown in FIG. 11, in the present embodiment, the holding apparatus 82 holds the base material 1 such that a predetermined space is formed on the backside of the base material 1. Therefore, the HMDS layer is formed on almost the entire region of the under surface 1B of the base material 1 in addition to the upper surface 1A and side surface 1C of the base material 1. In the description below, the treatment in which the HMDS layer 7 is formed on the base material 1 is appropriately referred to as an HMDS treatment.

Figure 12:
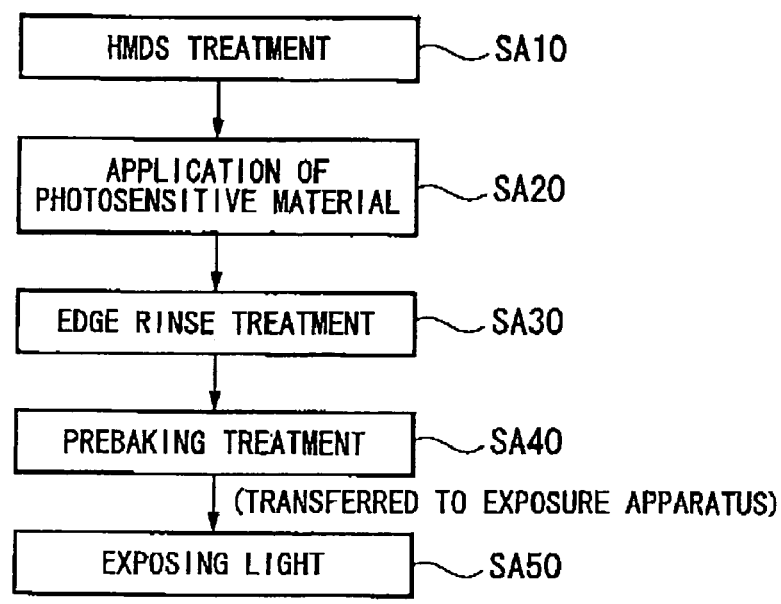
FIG. 12 is a flowchart for explaining an exposure method according to the eighth embodiment.
Figure 13A:
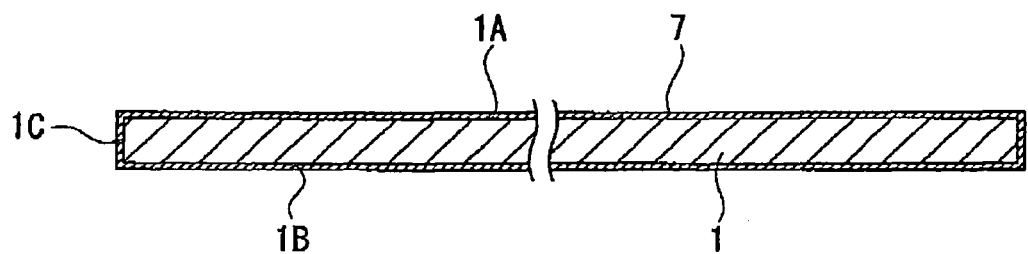
FIG. 13A is a schematic diagram for explaining the exposure method according to the eighth embodiment.
Figure 13B:
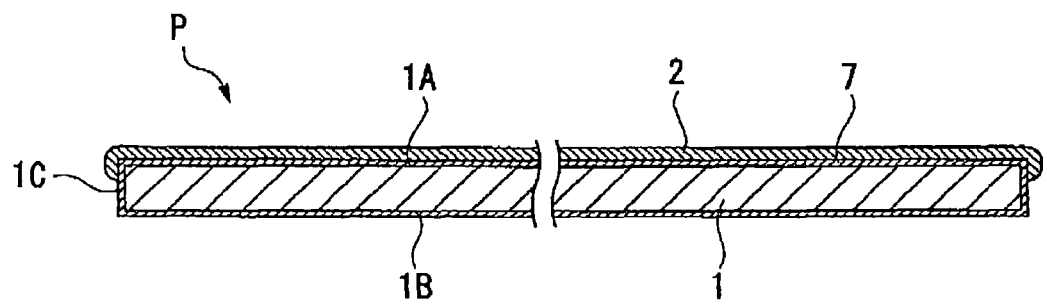
FIG. 13B is another schematic diagram for explaining the exposure method according to the eighth embodiment.
Figure 13C:
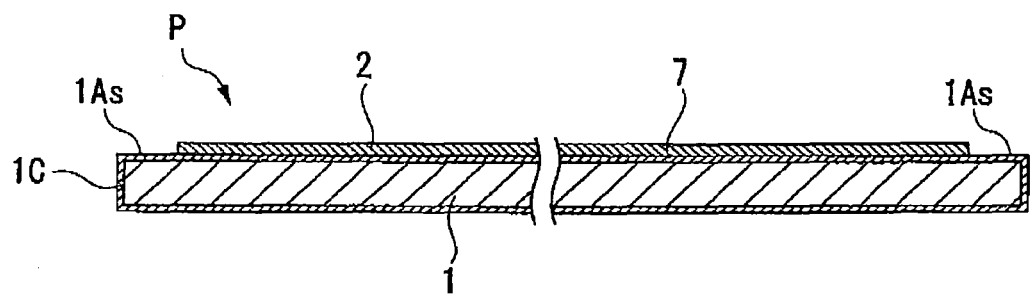
FIG. 13C is another schematic diagram for explaining the exposure method according to the eighth embodiment.

An example of process steps for forming the substrate P shown in FIG. 10 will be described in the next place with reference to FIG. 12 and FIGS. 13A to 13C. FIG. 12 is a flowchart showing an example of process steps. FIGS. 13A to 13C are schematic diagrams for explaining an example of process steps.

The film forming apparatus 80 described with reference to FIG. 11 forms first the HMDS layer 7 on the upper surface 1A, under surface 1B, and side surface 1C of the base material 1 respectively (Step SA10). The HMDS layer 7 is formed on the base material 1 due to the contact between the surface of the base material 1 and the gaseous HMDS. Therefore, the HMDS layer 7 can be smoothly formed on the upper surface 1A, under surface 1B, and side surface 1C of the base material 1 respectively. FIG. 13A shows the base material 1 having been subjected to the HMDS treatment.

A process for coating the photosensitive material 2 on the HMDS layer 7 of the base material 1 is performed (Step SA20) in the next place. The coater/developer C/D forms the film of the photosensitive material 2 on the HMDS layer 7 of the base material 1 by a predetermined coating method such as the spin coat method. FIG. 13B shows the substrate P having been coated with the photosensitive material 2.

The edge rinse treatment is performed in the next place in which the photosensitive material 2 is removed from the peripheral region 1As and the side surface 1C (Step SA30). As a result, the photosensitive material 2 is removed from the peripheral region 1As of the base material 1 (substrate P). FIG. 13C shows the substrate P having been subjected to the edge rinse treatment.

The substrate P is then subjected to a predetermined process such as a prebake process (Step SA40). After that, the substrate P is transferred to the exposure apparatus EX by a predetermined transfer system, and is exposed (Step SA50).

Even after the edge rinse treatment or the prebake process, the region, of the peripheral region of the substrate P, that has been subjected to the edge rinse treatment is covered with the HMDS layer 7. In other words, even if the edge rinse treatment or the prebake process is performed, the HMDS layer 7 formed on the base material 1 will never be removed. Therefore, even after the edge rinse treatment, liquid-repellency of the peripheral region of the upper surface of the substrate P can be retained. Similarly, even after the edge rinse treatment or the prebake process, the side surface and under surface of the substrate P are covered with the HMDS layer 7 to retain liquid-repellency.

Ninth Embodiment

Figure 14:
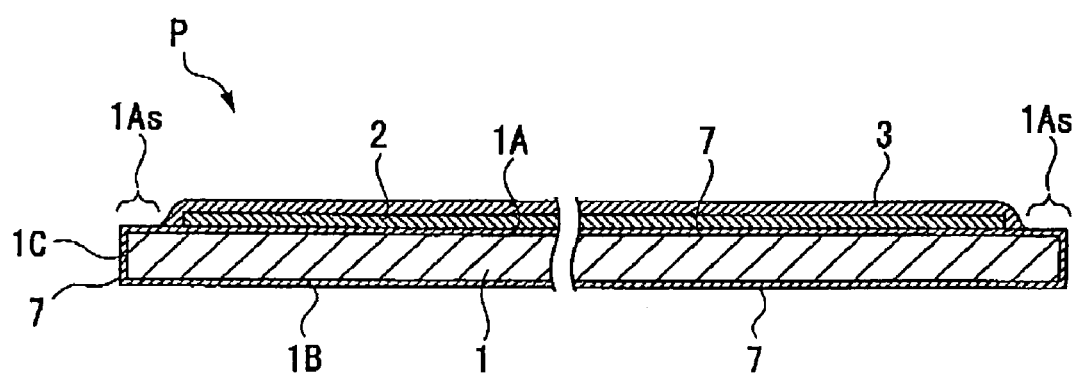
FIG. 14 is a schematic diagram showing a substrate according to a ninth embodiment.
Figure 15:
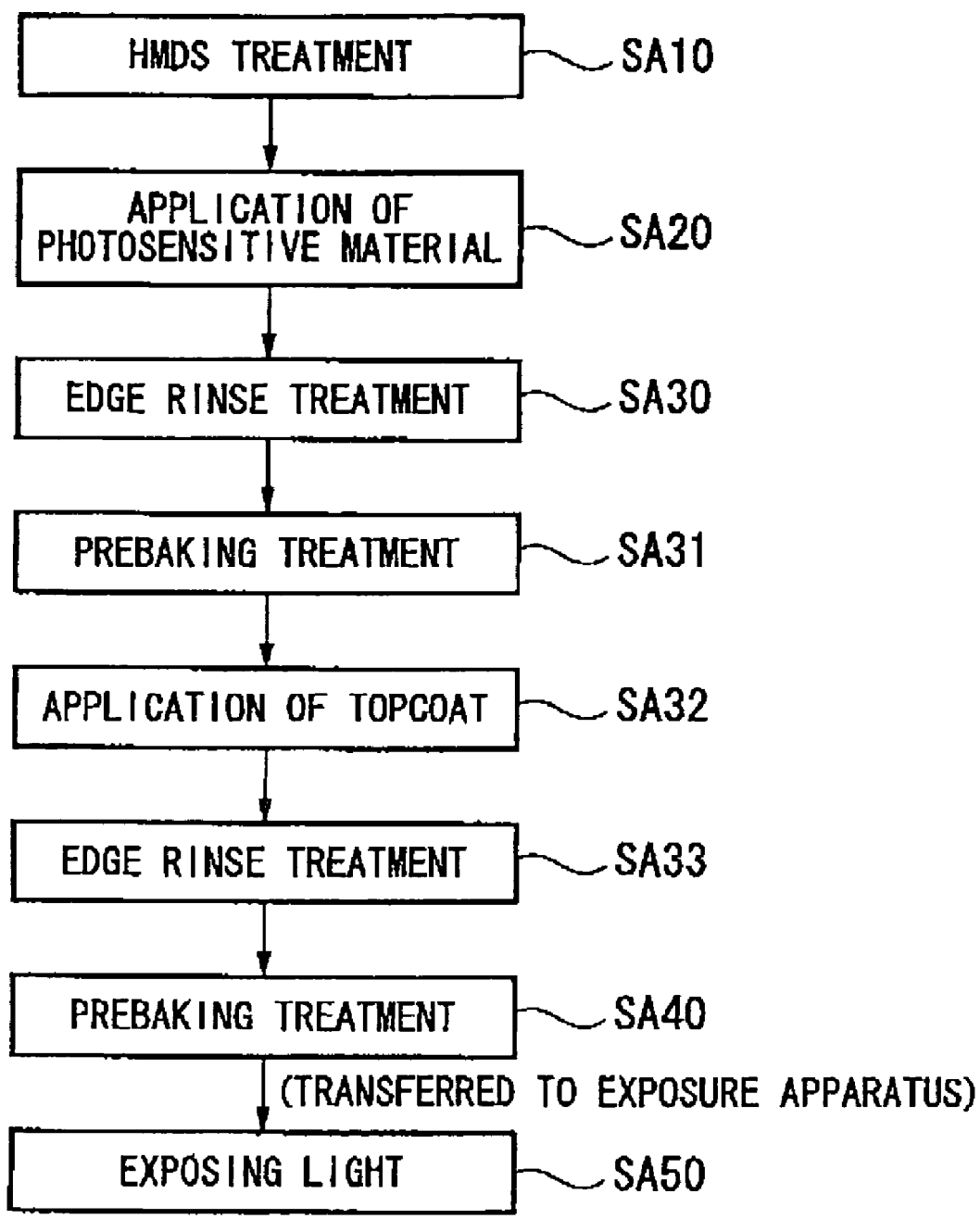
FIG. 15 is a flowchart for explaining an exposure method according to the ninth embodiment.

A ninth embodiment will be described in the next place. FIG. 14 shows a substrate P according to the present embodiment. Similarly, in FIG. 14, the substrate P includes: a base material 1; and an HMDS layer 7 formed on an upper surface 1A, under surface 1B, and side surface 1C of the base material 1. A film of a photosensitive material 2 is formed on most of the upper surface 1A of the base material except on a peripheral region 1As. Thus, the film of the photosensitive material 2 is not formed on the peripheral region 1As of the upper surface 1A of the base material 1, the side surface 1C of the base material 1, or the under surface 1 of the base material 1. Furthermore, a film of a first material 3 (topcoat film) is formed so as to cover the photosensitive material 2. In the present embodiment, the film of the first material 3 is formed so as to cover the photosensitive material 2 and part of the peripheral region 1As. Therefore, the HMDS layer 7 is exposed from part of the peripheral region 1As. The film of the first material 3 is not formed on the side surface 1C of the base material 1 or the under surface 1B of the base material 1.

An example of process steps for forming the substrate P shown in the FIG. 14 will be described in the next place with reference to FIG. 15 and FIGS. 16A to 16E. FIG. 14 is a flowchart showing an example of process steps. FIGS. 16A to 16E are schematic diagrams for explaining an example of process steps.

Figure 16A:
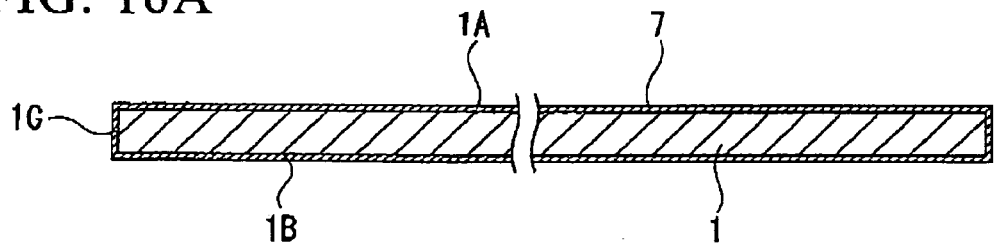
FIG. 16A is a schematic diagram for explaining the exposure method according to the ninth embodiment.

The film forming apparatus 80 described with reference to FIG. 11 forms first the HMDS layer 7 on the upper surface 1A, under surface 1B, and side surface 1C of the base material 1 (Step SA10) FIG. 16A shows the base material 1 having been subjected to the HMDS treatment.

Figure 16B:
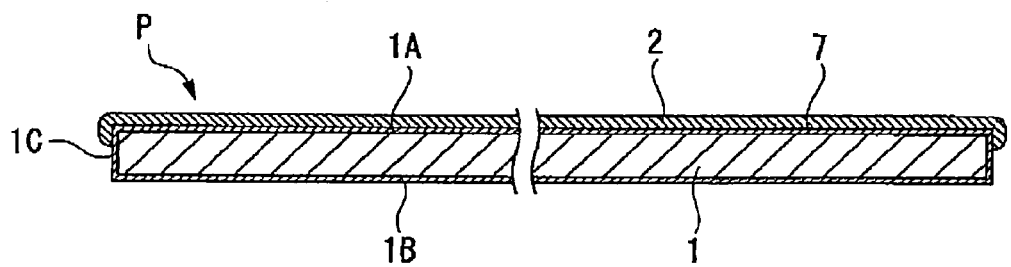
FIG. 16B is another schematic diagram for explaining the exposure method according to the ninth embodiment.

A process for coating the photosensitive material 2 on the HMDS layer 7 of the base material 1 is performed (Step SA20) in the next place. The coater/developer C/D coats the photosensitive material 2 on the HMDS layer 7 of the base material 1 by a predetermined coating method such as the spin coat method. FIG. 16B shows the substrate P having been coated with the photosensitive material 2.

Figure 16C:
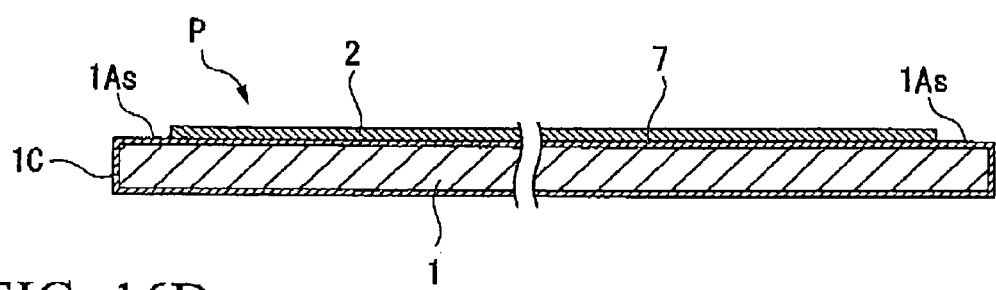
FIG. 16C is another schematic diagram for explaining the exposure method according to the ninth embodiment.

The edge rinse treatment is performed for removing the photosensitive material 2 from the peripheral region 1As and the side surface 1C (Step SA30) in the next place. As a result, the photosensitive material 2 is removed from the peripheral region 1As of the base material 1 (substrate P). FIG. 16C shows the substrate P having been subjected to the edge rinse treatment.

The substrate P is then subjected to a predetermined process such as a prebake process (Step SA31).

Figure 16D:
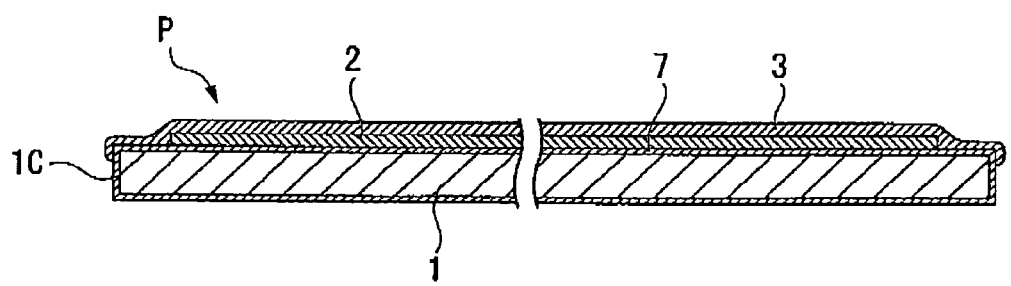
FIG. 16D is another schematic diagram for explaining the exposure method according to the ninth embodiment.

A process for coating the first material 3, which is used for forming a topcoat film on the film of the photosensitive material 2 on the base material 1, is performed (Step SA32) in the next place. The coater/developer C/D coats the first material 3 on the film of the photosensitive material 2 previously formed on the base material 1 by a predetermined coating method such as the spin coat method. FIG. 16D shows the substrate P having been coated with the first material 3.

Figure 16E:
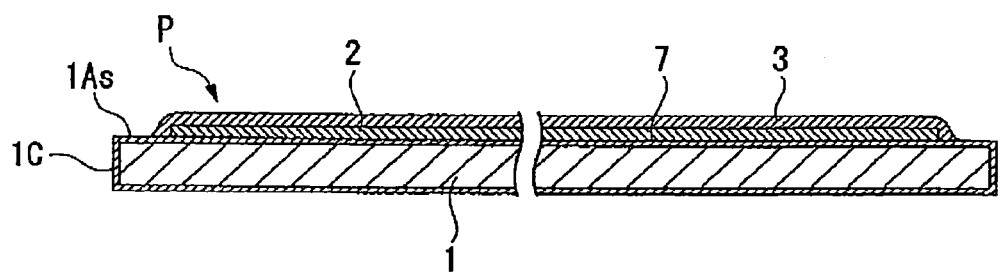
FIG. 16E is another schematic diagram for explaining the exposure method according to the ninth embodiment.

The edge rinse treatment is performed for removing the first material 3 from the peripheral region 1As and the side surface 1C (Step SA33) in the next place. This removes the first material 3 from the peripheral region 1As of the base material 1 (substrate P). FIG. 16E shows the substrate P having been subjected to the edge rinse treatment.

The substrate P is then subjected to a predetermined process such as a prebake process (Step SA40). After that, the substrate P is transferred to the exposure apparatus EX by a predetermined transfer system, and is subjected to exposure processes (Step SA50).

Even after the edge rinse treatment or the prebake process, the region, of the peripheral region of the substrate P, that has been subjected to the edge rinse treatment is covered with the HMDS layer 7. In other words, even if the edge rinse treatment or the prebake process is performed, the HMDS layer formed on the base material 1 will never be removed. Therefore, even after the edge rinse treatment, liquid-repellency of the peripheral region of the upper surface of the substrate P can be retained. Similarly, even after the edge rinse treatment or the prebake process, the side surface and under surface of the substrate P are covered with the HMDS layer 7 to retain liquid-repellency.

Thus, when the film of the photosensitive material 2 and the topcoat film 3 are formed after the formation of the HMDS layer 7 on the base material 1, a desired region of the surface of the substrate P (in FIG. 14, almost the entire region of the surface of the substrate P) can be made liquid-repellent (water-repellent), even after the edge rinse treatment.

Tenth Embodiment

Figure 17:
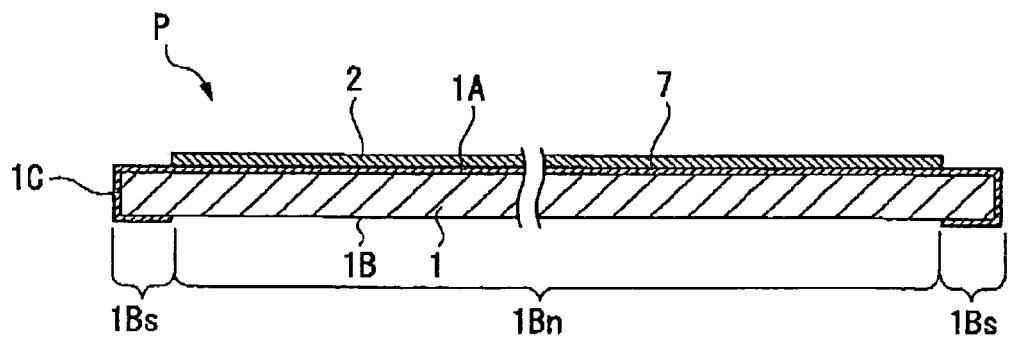
FIG. 17 is a schematic block diagram showing a substrate according to a tenth embodiment.

A tenth embodiment will be described with reference to FIG. 17. As shown in FIG. 17, the HMDS layer 7 can be provided only on part of the region of the under surface 1B of the base material 1, instead of the entire region thereof. In an example shown in FIG. 17, the HMDS layer 7 is formed so as to cover a peripheral region 1Bs of the under surface 1B of the base material 1. When a non-formation region 1Bn that is not subjected to the HMDS treatment is formed, the base material 1 may be positioned inside the sealed chamber 81 of the film forming apparatus 80, for example, in a state in which the region corresponding to the non-formation region 1Bn of the under surface 1B of the base material 1 is covered with a cover (mask), and subsequently the gaseous HMDS may be supplied to the inside of the sealed chamber 81.

Eleventh Embodiment

Figure 18:
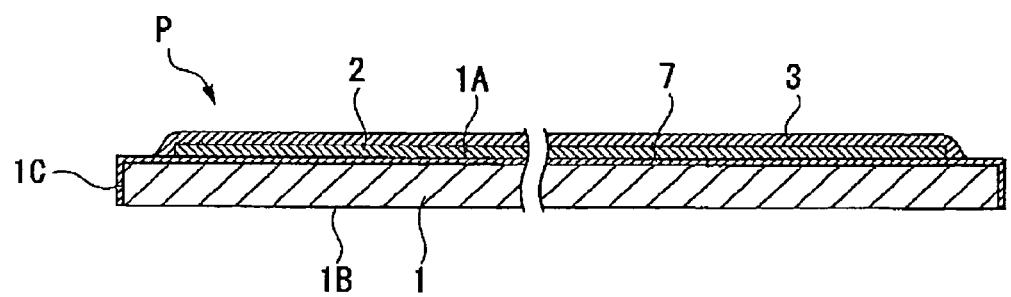
FIG. 18 is a schematic block diagram showing a substrate according to an eleventh embodiment.

An eleventh embodiment will be described with reference to FIG. 18. As shown in FIG. 18, the MHDS layer 7 can be provided only on the side surface 1C and the upper surface 1A of the base material 1, instead of the under surface 1B of the base material 1. Similarly, in this case, the base material 1 and the gaseous HMDS may contact in a state where the region that should not be subjected to the HMDS treatment is covered with a cover (mask).

Twelfth Embodiment

Figure 19:
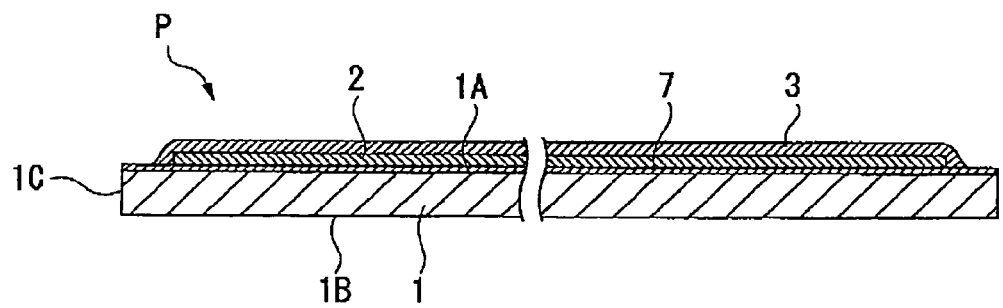
FIG. 19 is a schematic block diagram showing a substrate according to a twelfth embodiment.

A twelfth embodiment will be described with reference to FIG. 19. As shown in FIG. 19, the HMDS layer 7 may be provided only on the upper surface 1A of the base material 1, instead of the under surface 1B and side surface 1C of the base material 1.

As described above, in the eighth to twelfth embodiments, the HMDS layer is formed on the base material 1. Thus, even if the substrate P is subjected to the edge rinse treatment after the formation of the photosensitive material 2 and/or the topcoat film, the HMDS layer 7 is maintained in a desired region of the peripheral region of the substrate P, enabling liquid-repellency (desirably, a static contact angle of 60 degrees or greater with respect to the liquid LQ) of the desired region of the peripheral region of the substrate P to be maintained. As a result, by taking the substrate P on which the HMDS layer 7 is formed as the exposure target, flow of the liquid LQ from the gap A formed around the substrate P held on the substrate holder PH can be suppressed. Furthermore, elution of a substance from the base material 1 (foundation) on which the MHDS layer 7 is formed can also be suppressed.

In the eighth to twelfth embodiments, the HMDS layer formed on the base material 1 may not have to have a function for improving the contact with the photosensitive material 2. That is, the HMDS layer may be formed on the upper surface of the base material 1 with only an aim of providing the peripheral region of the upper surface of the substrate P with liquid-repellency.

Similarly, in the eighth to twelfth embodiments, the surface of the base material 1 on which the HMDS layer is formed is not limited to the surface of the silicon substrate, but may be: an oxide film of $SiO_2$, etc.; an oxide film of $SiO_2$, etc., insulating film of $SiO_2$, SiNx, etc., metal/conductive film of Cu, Al—Si, etc., or semiconductor film of amorphous Si. etc. that has been generated in the previous processes; or a mixture of these.

In the first to twelfth embodiments above, the upper surface 51 of the substrate state PST may not be flush with the surface of the substrate P held on the substrate stage PST as long as the liquid immersion region AR2 can be formed in a desired state.

Also, in the first to twelfth embodiments, the upper surface 33A and side surface 33S of the peripheral wall 33, the inner side surface 50T of the Z stage 52, and the surface of the base member 35 including the surface of the supporting portions 34 and the bottom surface 35B have liquid-repellency. However, they may not have to have liquid-repellency and only part of them may be provided with liquid-repellency.

As described above, pure water is used as the liquid LQ in the present embodiment. Pure water is advantageous in that it can be easily obtained in large quantity at semiconductor manufacturing plants, etc. and in that it has no adverse effects on the photosensitive material on the substrate P or on the optical elements (lenses), etc. In addition, pure water has no adverse effects on the environment and contains very few impurities, so one can also expect an action whereby the upper surface of the substrate P and the surface of the optical element provided on the front end surface of the projection optical system PL are cleaned. In the case where the purity of the pure water supplied from plants, etc. is low, the exposure apparatus may be adapted to have a pure water production apparatus.

In addition, the refractive index n of pure water (water) with respect to exposure light EL with a wavelength of 193 nm is said to be nearly 1.44, so in the case where an ArF excimer laser light (193 nm wavelength) is used as the light source of the exposure light EL, it is possible to shorten the wavelength to 1/n, that is, approximately 134 nm, on the substrate P to obtain high resolution. Furthermore, the depth of focus is expanded by approximately n times, that is approximately 1.44 times, compared with it being in air, so in the case where it would be permissible to ensure the same level of depth of focus as the case in which it is used in air, it is possible to further increase the numerical aperture of the projection optical system PL, and resolution improves on this point as well.

When the liquid immersion method is used as described above, the numerical aperture NA of the projection optical system may sometimes become 0.9 to 1.6. When, in this manner, the numerical aperture NA of the projection optical system becomes significant, random-polarized light conventionally used as the exposure light may, because of its polarization effect, adversely affect the imaging performance; thus, a polarized light illumination method is preferably used. In this case, it is preferable that by performing linearly polarized light illumination in which the longitudinal direction of the line pattern of the line-and-space pattern on the mask (reticle) is aligned with the polarization direction, a lot of diffraction light beams from S polarization components (TE polarization components), i.e., the diffraction light beams from the polarization components having the polarization direction in line with the longitudinal direction of the line pattern are emitted from the pattern of the mask (reticle). When the space between the projection optical system PL and the photosensitive material coated on the upper surface of the substrate P (base material 1) is filled with the liquid, the light transmittance at the photosensitive material surface of the diffraction light beams from S polarization components (TE polarization components), which contribute to the improvement of the contrast, is higher than in the case where the space between the projection optical system PL and the photosensitive material coated on the upper surface of the substrate P (base material 1) is filled with gas (air), a high imaging performance can be obtained even in the case where the numerical aperture NA of the projection optical system is over 1.0. Also, a phase shift mask, an oblique entrance illumination method (in particular, the dipole illumination method), as disclosed in Japanese Unexamined Patent Application, First Publication No. H06-188169, in which the illumination direction is aligned with the longitudinal direction of the line pattern, etc. may be appropriately combined with the above configuration, which works more effectively. In particular, the combination of the linearly polarized light illumination method and the dipole illumination method works effectively in the case where periodic directions of the line-and-space pattern are limited to a predetermined single direction, or in the case where hole patterns are densely populated along a predetermined single direction. For example, in the case where a halftone phase shift mask (a pattern with a halfpitch of approximately 45 nm) with a light transmittance of 6% is illuminated by concurrent use of the linearly polarized light illumination method and the dipole illumination method, the depth of focus (DOF) can be increased by approximately 150 nm compared with the use of random-polarized light, where illumination σ defined by the circumcircle of the two light fluxes forming a dipole on the pupil surface of the illumination system is set to 0.95; the radius of each light flux on the pupil surface is set to 0.125σ; and the numerical aperture of the projection optical system PL is set as NA=1.2.

Also, when by using, for example, an ArF excimer laser beam as the exposure light and using the projection optical system PL having a reduction magnification of approximately ¼, a fine line-and-space pattern (e.g., line-and-space of approximately 25 to 50 nm) is exposed onto the substrate P, depending on the structure of the mask M (e.g., the fineness of the pattern or the thickness of chrome), the mask M acts as a polarization plate due to the wave guide effect, and a greater amount of the diffraction light from S polarization components (TE polarization components) is emitted from the mask M than the amount of the diffraction light from P polarization components (TM polarization components) which lower the contrast. In this case, the above-described linearly polarized light illumination is desirably employed. However, also by illuminating the mask M with random-polarized light, a high resolution performance can be obtained even in the case where the numerical aperture NA of the projection optical system PL is large, e.g., 0.9 to 1.6.

Furthermore, when a very fine line-and-space pattern on the mask M is exposed onto the substrate P, there is the possibility that the emitted amount of the P polarization components (TM polarization components) becomes larger than the emitted amount of the S polarization components (TE polarization components) due to the wire grid effect. However, when by using, for example, an ArF excimer laser light as the exposure light and using the projection optical system PL having a reduction magnification of approximately ¼, a line-and-space pattern of more than 25 nm is exposed onto the substrate P, a greater amount of the diffraction light from S polarization components (TE polarization components) is emitted from the mask M than the amount of the diffraction light from P polarization components (TM polarization components). Therefore, a high resolution performance can be obtained even in the case where the numerical aperture NA of the projection optical system is significant, e.g., 0.9 to 1.3.

Also, not only the linearly polarized light illumination (S polarized light illumination) in which the longitudinal direction of the line pattern on the mask (reticle) is aligned with the polarization direction, but also the combination, as disclosed in Japanese Unexamined Patent Application, First Publication No. H06-53120, of the polarized light illumination method, in which the lights used are linearly polarized in the tangential (circumpherential) directions relative to a circle, of which the center is the optical axis, and an oblique entrance illumination method is effective. In particular, in the case where not only line patterns which extend in a predetermined single direction but also line patterns which extend in multiple different directions are included (line-and-space patterns with different periodic directions are included) in the pattern of the mask (reticle), by using, as also disclosed in Japanese Unexamined Patent Application, First Publication No. H06-53120, the polarized light illumination method, in which the lights used are linearly polarized in the tangential directions relative to a circle, of which the center is the optical axis, in combination with an orbicular zone illumination method, a high resolution performance can be obtained even in the case where the numerical aperture NA of the projection optical system is significant. For example, in the case where a halftone phase shift mask (a pattern with a halfpitch of approximately 63 nm) with a light transmittance of 6% is illuminated by using the linearly polarized light illumination method in which the lights used are linearly polarized in the tangential directions relative to a circle, of which the center is the optical axis, in combination with the orbicular zone illumination method (orbicular zone ratio of 3/4), the depth of focus (DOF) can be increased by approximately 250 μm compared with the case where random-polarized light is used, if illumination σ is set to 0.95; and the numerical aperture of the projection optical system PL is set as NA=1.00. Therefore, in the case of a pattern with a halfpitch of approximately 55 nm and the numerical aperture of the projection optical system NA=1.2, the depth of focus can be increased by approximately 100 nm.

A progressive exposure method as disclosed in Japanese Unexamined Patent Application, First Publication No. H04-277612 and Japanese Unexamined Patent Application, First Publication No. 2001-345245 is additionally applicable.

In the present embodiments, the optical element LS is attached to the front end of the projection optical system PL, and the optical characteristics of the projection optical system PL, for example, aberration (spherical aberration, coma aberration, etc.) can be adjusted by means of the lens. As the optical element to be attached to the front end of the projection optical system PL, an optical plate used for the adjustment of the optical characteristics of the projection optical system PL may be utilized. Alternatively, a plane parallel plate that can transmit the exposure light EL may be utilized.

In the case where the pressure, caused by the flow of the liquid LQ, of the space between the optical element at the front end of the projection optical system PL and the substrate P is significant, it may be configured such that the optical element is rigidly fixed so as not to move due to the pressure, instead of making the optical element replaceable.

In the present embodiments, it is configured such that the space between the projection optical system PL and the upper surface of the substrate P is filled with the liquid LQ. However, it may be configured, for example, such that the space is filled with the liquid LQ with a cover glass constituted by a plane parallel plate being attached to the upper surface of the substrate P.

Also, in the projection optical system of the above embodiments, the optical path space on the image plane facing to the optical element at the front end is filled with a liquid, but a projection optical system may be adopted, as disclosed in PCT International Publication No. WO 2004/019128, in which the optical path space on the object plane side of the optical element at the front end is also filled with a liquid.

The liquid LQ of the present embodiments is water, but it may be a liquid other than water. For example, if the light source of the exposure light EL is an $F_2$ laser, this $F_2$ laser light does not transmit through water, so the liquid LQ may be, for example, a fluorocarbon fluid such as a perfluoropolyether (PFPE) or a fluorocarbon oil that an $F_2$ laser can transmit through. In this case, the part to be in contact with the liquid LQ is applied with lyophilic treatment by forming a thin film using a substance with a molecular structure that has a small polarity including fluorine. In addition, it is also possible to use, as the liquid LQ, liquids (for example, cedar oil) that have the transmittance with respect to the exposure light EL and whose refractive index is as great as possible and that are stable with respect to the photosensitive material coated on the projection optical system PL or the upper surface of the substrate P (base material 1). Similarly, in this case, the surface treatment is performed in accordance with the polarity of the liquid LQ to be used.

Also, a liquid with a refractive index of approximately 1.6 to 1.8 may be used for the liquid LQ. Furthermore, the optical element LS1 may be formed from quartz, or a material with a higher refractive index than that of quartz or fluorite (for example, above 1.6).

It is to be noted that as for substrate P of each of the above embodiments, not only a semiconductor wafer for manufacturing semiconductor devices, but also a glass substrate for a display device, a ceramic wafer for a thin film magnetic head, or a master mask or reticle (synthetic quartz or silicon wafer), etc. can be used.

As for the exposure apparatus EX, in addition to a scan type exposure apparatus (scanning stepper) in which while synchronously moving the mask M and the substrate P, the pattern of the mask M is scan-exposed, a step-and-repeat type projection exposure apparatus (stepper) in which the pattern of the mask M is exposed at one time in the condition that the mask M and the substrate P are stationary, and the substrate P is successively moved stepwise can be used.

Also, as for the exposure apparatus EX, the present invention can be applied to an exposure apparatus of a method in which a reduced image of a first pattern is exposed in a batch on the substrate P by using the projection optical system (for example, a refractive projection optical system having, for example, a reduction magnification of ⅛, which does not include a reflecting element), in the state with the first pattern and the substrate P being substantially stationary. In this case, the present invention can be also applied to a stitch type batch exposure apparatus in which after the reduced image of the first pattern is exposed in a batch, a reduced image of a second pattern is exposed in a batch on the substrate P, partially overlapped on the first pattern by using the projection optical system, in the state with the second pattern and the substrate P being substantially stationary. As for the stitch type exposure apparatus, the present invention can be also applied to a step-and-stitch type exposure apparatus in which at least two patterns are transferred onto the substrate P in a partially overlapping manner and the substrate P is sequentially moved.

Also, the present invention can also be applied to a twin stage type exposure apparatus as disclosed in Japanese Unexamined Patent Application, First Publication No. H10-163099, Japanese Unexamined Patent Application, First Publication No. H10-214783, Published Japanese Translation No. 2000-505958 of PCT International Application, etc.

Moreover, the present invention can also be applied to an exposure apparatus furnished with a substrate stage for holding a substrate and with a measurement stage on which is mounted a reference member formed with a reference mark, or various photoelectronic sensors, as disclosed in Japanese Unexamined Patent Application, First Publication No. H11-135400, and Japanese Unexamined Patent Application, First Publication No. 2000-164504.

Furthermore, in the above embodiments, an exposure apparatus in which the liquid is locally filled in the space between the projection optical system PL and the substrate P is used. However, the present invention can also be applied to a liquid immersion exposure apparatus in which the whole surface of the target exposure substrate is covered with a liquid. The configuration and exposure operation of a liquid immersion exposure apparatus in which the whole surface of the target exposure substrate is covered with a liquid are described in detail in, for example, Japanese Unexamined Patent Application, First Publication No. H06-124873, Japanese Unexamined Patent Application, First Publication No. H10-303114, and U.S. Pat. No. 5,825,043.

The types of exposure apparatuses EX are not limited to exposure apparatuses for semiconductor element manufacture that expose a semiconductor element pattern onto a substrate P, but are also widely applicable to exposure apparatuses for the manufacture of liquid crystal display elements and for the manufacture of displays, and exposure apparatuses for the manufacture of thin film magnetic heads, image pickup elements (CCD), and reticles or masks.

In the abovementioned embodiments, an optical transmission type mask formed with a predetermined shielding pattern (or phase pattern or dimming pattern) on an optical transmission substrate is used. However, instead of this mask, for example as disclosed in U.S. Pat. No. 6,778,257, an electronic mask for forming a transmission pattern or reflection pattern, or a light emitting pattern, based on electronic data of a pattern to be exposed may be used.

Furthermore the present invention can also be applied to an exposure apparatus (lithography system) which exposes a run-and-space pattern on a substrate P by forming interference fringes on the substrate P, as disclosed in PCT International Patent Publication No. WO 2001/035168 pamphlet.

When using a linear motor (see U.S. Pat. No. 5,623,853 or U.S. Pat. No. 5,528,118) in the substrate stage PST or the mask stage MST, either air-cushion type linear motor that uses an air bearing or a magnetic levitation type linear motor that uses a Lorentz force or reactance force may be used. Furthermore, the respective stages PST, MST may be the types that move along a guide or may be the guideless types in which a guide is not provided.

As the driving mechanism for the respective stages PST, MST, a planar motor in which by making a magnet unit in which magnets are two-dimensionally arranged and an armature unit in which coils are two-dimensionally arranged face each other, each of substrate stage PST and mask stage MST is driven by an electromagnetic force may be used. In this case, either one of the magnet unit and the armature unit is attached to the stage PST or the stage MST, and the other unit is attached to the moving surface side of the stage PST or the stage MST.

A reaction force generated by the movement of the substrate stage PST may be, as described in Japanese Unexamined Patent Application, First Publication No. H08-166475 (U.S. Pat. No. 5,528,118), mechanically released to the floor (earth) by use of a frame member so that the force does not transmit to the projection optical system PL.

A reaction force generated by the movement of the mask stage MST may be, as described in Japanese Unexamined Patent Application, First Publication No. H08-330224 (U.S. Pat. No. 5,874,820), mechanically released to the floor (earth) by use of a frame member so that the force does not transmit to the projection optical system PL.

As described above, the exposure apparatus EX of the embodiments of this application is manufactured by assembling various subsystems, including the respective constituent elements presented in the Scope of Patents Claims of the present application, so that the prescribed mechanical precision, electrical precision and optical precision can be maintained. To ensure these precisions, adjustments are performed before and after this assembly in order to achieve optical precision with respect to the various optical systems, mechanical precision with respect to the various mechanical systems, and electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly to the exposure apparatuses of the various subsystems has ended, overall assembly is performed, and the various precisions are ensured for the exposure apparatus as a whole. Note that it is preferable that the manufacture of the exposure apparatus be performed in a clean room in which the temperature, the degree of cleanliness, etc. are controlled.

Figure 20:
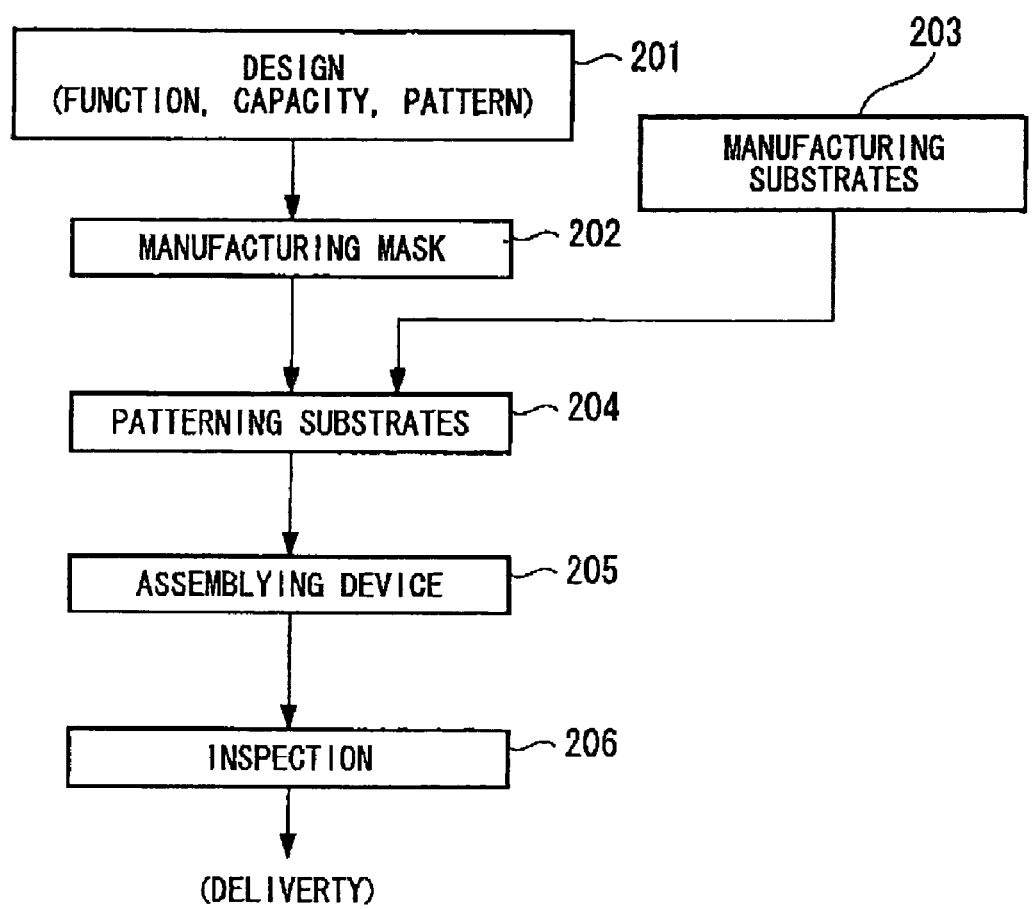
FIG. 20 is a flowchart showing an example of manufacturing steps for a micro device.

As shown in FIG. 20, microdevices such as semiconductor devices are manufactured by going through; a step 201 that performs microdevice function and performance design, a step 202 that creates the mask (reticle) based on this design step, a step 203 that manufactures the substrate that is the device base material, a substrate processing step 204 that exposes the pattern on the mask onto a substrate by means of the exposure apparatus EX of the aforementioned embodiments, a device assembly step (including a dicing process, a bonding process and a packaging process) 205, and an inspection step 206, and so on.

The invention claimed is:

1. An exposure method for emitting an exposure light onto a substrate via a liquid to expose the substrate,
   wherein a surface of a base material that is used as the substrate has an effective region coated with a photosensitive material,
   wherein at least part of the surface of the base material is coated with a predetermined material such that the surfaces of the base material do not come into contact with the liquid on an outside of the effective region, and
   wherein the surface of the base material includes a peripheral region where the photosensitive material is not disposed.

2. The exposure method according to claim 1, wherein the outside of the effective region includes the peripheral region of the base material.

3. The exposure method according to claim 2, wherein the outside of the effective region includes a side surface of the base material.

4. The exposure method according to claim 1, wherein the surface of the base material includes: a first surface that includes the effective region coated with the photosensitive material; and a second surface that faces the first surface, and
   wherein the outside of the effective region includes at least a part of the second surface of the base material.

5. The exposure method according to claim 1, wherein the predetermined material includes the photosensitive material coated on the effective region.

6. The exposure method according to claim 1, wherein the predetermined material further coats the photosensitive material.

7. The exposure method according to claim 1, wherein the predetermined material has liquid-repellency to the liquid.

8. The exposure method according to claim 1, wherein the surface of the base material on the outside of the effective region is coated with a predetermined material to prevent an elution of a substance constituting the surface of the base material into the liquid.

9. The exposure method according to claim 1, wherein the surface of the base material includes a surface of a silicon substrate.

10. The exposure method according to claim 1, wherein the surface of the base material includes an oxide film layer.

11. The exposure method according to claim 1, wherein the surface of the base material includes a metal layer.

12. The exposure method according to claim 1, wherein the surface of the base material includes an insulating film layer.

13. The exposure method according to claim 1, wherein the photosensitive material is removed from the outside of the effective region by an edge rinse treatment.

14. An exposure method for shining an exposure light onto a substrate held on a substrate holder via a liquid to expose the substrate,
   wherein the substrate holder has a flat portion around the substrate,
   wherein an HMDS layer is formed on a peripheral region of the substrate to suppress a leakage of a liquid into a gap between the substrate held on the substrate holder and the flat portion, and
   wherein a film of a photosensitive material is disposed on a surface of the substrate that does not include the peripheral region of the substrate.

15. The exposure method according to claim 14, wherein the HMDS layer is formed on an upper surface of the substrate.

16. The exposure method according to claim 14, wherein the HMDS layer is formed on a side surface of the substrate.

17. The exposure method according to claim 14, wherein the HMDS layer is formed on an under surface of the substrate.

18. The exposure method according to claim 14, wherein the HMDS layer is formed on a part of the peripheral region of the substrate, the part being subjected to an edge rinse treatment.

19. The exposure method according to claim 18, wherein the HMDS layer is formed after the edge rinse treatment.

20. The exposure method according to claim 18, wherein the HMDS layer is formed before the edge rinse treatment.

21. The exposure method according to claim 20, wherein the HMDS layer is formed before the film of the photosensitive material is formed on the substrate.

22. A device manufacturing method that uses the exposure method according to claim 1.

* * * * *